(12) United States Patent
Kudo et al.

(10) Patent No.: US 11,458,757 B2
(45) Date of Patent: *Oct. 4, 2022

(54) LITHOGRAPHIC PRINTING PLATE PRECURSOR AND METHOD OF PRODUCING LITHOGRAPHIC PRINTING PLATE

(71) Applicant: FUJIFILM Corporation, Tokyo (JP)

(72) Inventors: Kotaro Kudo, Shizuoka (JP); Yoshiki Morita, Shizuoka (JP); Keisho Funatsu, Shizuoka (JP); Taira Murakami, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 106 days.

This patent is subject to a terminal disclaimer.

(21) Appl. No.: 16/802,499

(22) Filed: Feb. 26, 2020

(65) Prior Publication Data
US 2020/0189306 A1 Jun. 18, 2020

Related U.S. Application Data

(63) Continuation of application No. PCT/JP2018/030245, filed on Aug. 13, 2018.

(30) Foreign Application Priority Data

Aug. 31, 2017 (JP) .............................. JP2017-167433

(51) Int. Cl.
*B41N 1/14* (2006.01)
*G03F 7/027* (2006.01)
*G03F 7/11* (2006.01)

(52) U.S. Cl.
CPC ............... *B41N 1/14* (2013.01); *G03F 7/027* (2013.01); *G03F 7/11* (2013.01)

(58) Field of Classification Search
CPC .................................. G03F 7/11; B41N 1/14
See application file for complete search history.

(56) References Cited

U.S. PATENT DOCUMENTS

| | | | | |
|---|---|---|---|---|
| 4,238,560 | A | * | 12/1980 | Nakamura ............... G03F 7/115 101/454 |
| 7,108,956 | B2 | | 9/2006 | Oda |
| 7,524,614 | B2 | | 4/2009 | Tao et al. |
| 8,679,726 | B2 | | 3/2014 | Balbinot et al. |
| 9,063,423 | B2 | | 6/2015 | Igarashi et al. |
| 10,099,468 | B2 | * | 10/2018 | Ooshima ............... B41C 1/1008 |
| 10,166,755 | B2 | | 1/2019 | Wariishi |
| 2004/0131966 | A1 | * | 7/2004 | Oda .......................... B41N 1/14 430/271.1 |
| 2007/0122739 | A1 | * | 5/2007 | Ezure .................... B41C 1/1025 430/270.1 |
| 2007/0231740 | A1 | | 10/2007 | Yanaka et al. |
| 2014/0242517 | A1 | | 8/2014 | Igarashi et al. |
| 2017/0114158 | A1 | | 4/2017 | Desmet et al. |

FOREIGN PATENT DOCUMENTS

| | | | |
|---|---|---|---|
| CN | 1470939 | 1/2004 | |
| CN | 101316720 | 12/2008 | |
| CN | 105027004 | 11/2015 | |
| CN | 106687300 | 5/2017 | |
| CN | 106715494 | 5/2017 | |
| EP | 1747883 | 1/2007 | |
| JP | 55032086 A * | 3/1980 | ............. G03F 7/115 |
| JP | S55032086 | 3/1980 | |
| JP | 01257949 A * | 10/1989 | |
| JP | H01257949 | 10/1989 | |
| JP | 03294382 A * | 12/1991 | |
| JP | H03289661 | 12/1991 | |
| JP | H03294382 | 12/1991 | |
| JP | 2000235255 | 8/2000 | |
| JP | 2007272143 | 10/2007 | |
| JP | 2015519610 | 7/2015 | |
| WO | WO-2016047309 A1 * | 3/2016 | ............... B41C 1/10 |
| WO | 2016052443 | 4/2016 | |

OTHER PUBLICATIONS

"International Search Report (Form PCT/ISA/210) of PCT/JP2018/030245," dated Oct. 30, 2018, with English translation thereof, pp. 1-5.
"Written Opinion of the International Searching Authority (Form PCT/ISA/237) of PCT/JP2018/030245," dated Oct. 30, 2018, with English translation thereof, pp. 1-11.
"Office Action of Japan Counterpart Application" with English translation thereof, dated Mar. 30, 2021, p. 1-p. 5.
"Office Action of China Counterpart Application", dated Dec. 29, 2020, with English translation thereof, p. 1-p. 13.
"Search Report of Europe Counterpart Application", dated Aug. 24, 2020, p. 1-p. 6.
"Office Action of China Counterpart Application", dated Aug. 27, 2021, with English translation thereof, p. 1-p. 15.
"Office Action of China Counterpart Application", dated Jan. 19, 2022, with English translation thereof, p. 1-p. 12.
"Office Action of India Counterpart Application", dated Nov. 16, 2021, p. 1-p. 6.

* cited by examiner

*Primary Examiner* — Chanceity N Robinson
(74) *Attorney, Agent, or Firm* — JCIPRNET

(57) ABSTRACT

A lithographic printing plate precursor includes an image recording layer on a support, in which the lithographic printing plate precursor has projections which are discontinuously formed on a surface of an outermost layer on a side where the image recording layer is provided, and a melting point of each projection is in a range of 70° C. to 150° C. A method of producing a lithographic printing plate includes a step of image-wise exposing the lithographic printing plate precursor to form an exposed portion and an unexposed portion, and a step of supplying at least one of printing ink or dampening water to remove the unexposed portion.

9 Claims, No Drawings

LITHOGRAPHIC PRINTING PLATE PRECURSOR AND METHOD OF PRODUCING LITHOGRAPHIC PRINTING PLATE

CROSS-REFERENCE TO RELATED APPLICATIONS

This application is a Continuation of International Application No. PCT/JP2018/030245 filed on Aug. 13, 2018, which claims priority to Japanese Patent Application No. 2017-167433 filed on Aug. 31, 2017. The entire contents of these applications are incorporated herein by reference.

BACKGROUND OF THE INVENTION

1. Field of the Invention

The present disclosure relates to a lithographic printing plate precursor and a method of producing a lithographic printing plate.

2. Description of the Related Art

A lithographic printing plate is typically formed of a lipophilic image portion that receives ink and a hydrophilic non-image portion that receives dampening water in the printing process.

Lithographic printing is a method of printing an image by setting a lipophilic image portion of a lithographic printing plate as an ink receiving unit and a hydrophilic non-image portion as a dampening water receiving unit (ink non-receiving unit) using the property in which water and oily ink repel each other, causing a difference in adhesiveness of ink to the surface of the lithographic printing plate, allowing the ink to be impressed only on an image portion, and transferring the ink to a printing medium such as paper.

Currently, in a plate-making step of producing a lithographic printing plate from a lithographic printing plate precursor, image exposure has been performed using a computer-to-plate (CTP) technology. That is, the image exposure is performed by directly scanning and exposing a lithographic printing plate precursor using a laser or a laser diode without using a lith film.

Further, with a growing interest in the global environment, environmental issues related to a waste liquid associated with wet treatments such as a development treatment have been highlighted in regard to plate-making for a lithographic printing plate precursor. Along with this, it is desired to simplify the development treatment or not to perform the development treatment. As one of a simple development treatment, a method referred to as "on-press development" has been suggested. The on-press development is a method of image-exposing a lithographic printing plate precursor, attaching the lithographic printing plate precursor to a printing press without performing a wet development treatment of the related art, and then removing a non-image portion of an image recording layer, at an initial stage of a typical printing step.

As lithographic printing plate precursors of the related art, those described in the specification of U.S. Pat. No. 7,524,614B, WO2016/052443A, and JP2015-519610A have been known.

SUMMARY OF THE INVENTION

After imaging, a lithographic printing plate precursor is developed (treated) in order to remove a non-imaging portion of an image-forming layer. The lithographic printing plate precursor is typically designed such that a water-soluble topcoat or a water-soluble oxygen-impermeable barrier layer is disposed on an image recording layer. This topcoat is used to improve a high polymerization rate during imaging by ensuring higher sensitivity of the image recording layer.

Such lithographic printing plate precursors are typically transported after production in a stack of several tens or several hundreds of individual precursors. In order to prevent an imaging surface from being scratched, an interleaf is inserted between precursors. However, regardless of the presence of the interleaf, there is a concern that a surface of the water-soluble topcoat is scratched during the transport operation (for example, during removal of the interleaf using an automated plate loader) so that the sensitivity of the scratched area is lost.

Further, it was found that since the lithographic printing plate precursor described in JP2015-519610A includes a water-soluble overcoat layer as an outermost layer, the outer layer has excellent scratch resistance, but the impressing property of a lithographic printing plate to be obtained is not sufficient.

An object to be achieved by an embodiment of the present invention is to provide a lithographic printing plate precursor which has an outer layer with excellent scratch resistance and from which a lithographic printing plate with an excellent impressing property is obtained.

An object to be achieved by another embodiment of the present invention is to provide a method of producing a lithographic printing plate obtained by using the lithographic printing plate precursor.

The means for achieving the above-described objects include the following aspects.

<1> A lithographic printing plate precursor comprising: an image recording layer on a support, in which the lithographic printing plate precursor has projections which are discontinuously formed on a surface of an outermost layer on a side where the image recording layer is provided, and a melting point of each projection is in a range of 70° C. to 150° C.

<2> The lithographic printing plate precursor according to <1>, in which an average dimension of the projections in a surface direction of the outermost layer is in a range of 0.1 µm to 45 µm.

<3> The lithographic printing plate precursor according to <1> or <2>, in which an average dimension of the projections in a surface direction of the outermost layer is in a range of greater than 0.7 µm and less than or equal to 30 µm.

<4> The lithographic printing plate precursor according to any one of <1> to <3>, in which an occupation area ratio of the projections in the surface of the outermost layer is 20% by area or less.

<5> The lithographic printing plate precursor according to any one of <1> to <4>, in which an occupation area ratio of the projections in the surface of the outermost layer is in a range of 0.5% by area to 20% by area.

<6> The lithographic printing plate precursor according to any one of <1> to <5>, in which each projection contains at least one resin selected from the group consisting of polyethylene and modified polyethylene.

<7> The lithographic printing plate precursor according to any one of <1> to <6>, in which each projection contains 80% by mass or greater of at least one resin selected from the group consisting of polyethylene and modified polyethylene.

<8> The lithographic printing plate precursor according to any one of <1> to <7>, which is an on-press development type lithographic printing plate precursor.

<9> A method of producing a lithographic printing plate comprising: a step of image-wise exposing the lithographic printing plate precursor according to any one of <1> to <8> to form an exposed portion and an unexposed portion; and a step of supplying at least one of printing ink or dampening water to remove a non-image portion.

According to an embodiment of the present invention, it is possible to provide a lithographic printing plate precursor which has an outer layer with excellent scratch resistance and from which a lithographic printing plate with an excellent impressing property is obtained.

Further, according to another embodiment of the present invention, it is possible to provide a method of producing a lithographic printing plate obtained by using the lithographic printing plate precursor.

DESCRIPTION OF THE PREFERRED EMBODIMENTS

Hereinafter, the contents of the present disclosure will be described in detail. The description of constituent elements below is made based on representative embodiments of the present disclosure in some cases, but the present disclosure is not limited to such embodiments.

Further, in the present specification, the numerical ranges shown using "to" indicate ranges including the numerical values described before and after "to" as a lower limit value and an upper limit value.

Further, in a case where substitution or unsubstitution is not noted in regard to the notation of a "group" (atomic group) in the present specification, the "group" includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both of acryl and methacryl, and the concept of "(meth)acryloyl" includes both of acryloyl and methacryloyl.

Further, the term "step" in the present specification indicates not only an independent step but also a step which cannot be clearly distinguished from other steps as long as the intended purpose of the step is achieved. Further, in the present disclosure, "% by mass" has the same definition as that for "% by weight", and "part by mass" has the same definition as that for "part by weight".

Further, in the present disclosure, a combination of two or more preferable aspects is a more preferable aspect.

Further, the weight-average molecular weight (Mw) and the number-average molecular weight (Mn) in the present disclosure are molecular weights in terms of polystyrene used as a standard substance, which are detected by using a solvent tetrahydrofuran (THF), a differential refractometer, and a gel permeation chromatography (GPC) analyzer using TSKgel GMHxL, TSKgel G4000HxL, and TSKgel G2000HxL (all trade names, manufactured by Tosoh Corporation) as columns, unless otherwise specified.

In the present specification, the term "lithographic printing plate precursor" includes not only a lithographic printing plate precursor but also a key plate precursor. Further, the term "lithographic printing plate" includes not only a lithographic printing plate produced by performing operations such as exposure and development, on a lithographic printing plate precursor as necessary but also a key plate. In a case of the key plate precursor, operations of exposure and development are not necessarily required. Further, a key plate is a lithographic printing plate precursor for attachment to a printing press that is not used, for example, in a case where printing is performed on a part of a paper surface with one or two colors in color newspaper printing.

Hereinafter, the present disclosure will be described in detail.

(Lithographic Printing Plate Precursor)

A lithographic printing plate precursor according to the embodiment of the present disclosure is a lithographic printing plate precursor including an image recording layer on a support, in which the lithographic printing plate precursor has projections which are discontinuously formed on a surface of an outermost layer on a side where the image recording layer is provided, and the melting point of each projection is in a range of 70° C. to 150° C.

Further, it is preferable that the lithographic printing plate precursor according to the embodiment of the present disclosure is an on-press development type lithographic printing plate precursor.

As the result of intensive research conducted by the present inventors, it was found that a lithographic printing plate precursor which has an outer layer with excellent scratch resistance and from which a lithographic printing plate with an excellent impressing property is obtained can be provided by employing the above-described configuration.

The mechanism of the excellent effects obtained by employing the configuration is not clear, but is assumed as follows.

As described above, the present inventors found that at least one of the scratch resistance of an outer layer in a lithographic printing plate precursor of the related art or the impressing property of a lithographic printing plate to be obtained by using the precursor is not sufficient, which is problematic.

As the result of intensive research conducted by the present inventors, in a case where the lithographic printing plate precursor has projections that are discontinuously formed on a surface of an outermost layer thereof, and the melting point of each projection is in a range of 70° C. to 150° C., the contact area is reduced due to the projections even in a case where another lithographic printing plate precursor is laminated thereon, and the projections are melted due to friction caused by scratching so that the scratched portion slips. Therefore, it was found that the above-described configuration greatly contributes to reduction of scratches, and thus the outer layer has excellent scratch resistance. Further, the present inventors found that since the projections are discontinuously formed, the image recording layer is sufficiently exposed and the lithographic printing plate to be obtained also has an excellent ink impressing property.

<Surface of Outermost Layer>

The lithographic printing plate precursor according to the embodiment of the present disclosure has projections that are discontinuously formed on the surface of the outermost layer on a side where the image recording layer is provided.

The surface of the outermost layer on a side where the image recording layer is provided is a surface of the image recording layer in a case where the image recording layer is an outermost layer, and the surface of the outermost layer is a surface of a protective layer in a case where the protective layer is an outermost layer.

<Discontinuously Formed Projections>

The lithographic printing plate precursor according to the embodiment of the present disclosure has projections that are discontinuously formed on the surface of the outermost layer.

The "discontinuously" in the present disclosure indicates that the projections do not cover the entire surface of the outermost layer.

The shape of the projection is not particularly limited, and any shape of a projection may be employed.

As the shape of the projection, a hemispherical shape, a spherical shape, a semielliptical shape, or an elliptical shape is preferable.

—Average Dimension of Projections—

From the viewpoints of the scratch resistance of the outer layer and the impressing property, the average dimension of the projections in the surface direction of the outermost layer is preferably in a range of 0.1 μm to 45 μm, more preferably greater than 0.5 μm and less than or equal to 35 μm, still more preferably in a range of 0.7 μm to 30 μm, and particularly preferably greater than 0.7 μm and less than or equal to 30 μm.

The average dimension of the projections in the present disclosure is measured according to the following method.

After a carbon or Pt—Pd film is applied to a sample as a conductive treatment such that the thickness thereof is set to 3 nm, a reflection electron image is observed at an acceleration voltage of 5 kV to 10 kV using a SU8010 type FE-SEM (manufactured by Hitachi High-Technologies Corporation). The area of the projections is calculated by performing a binarization processing on an image captured by setting the observation magnification of 1,000 times and N=3 using a difference in contrast between the projections and the surrounding area with image processing software (ImageJ or the like). The average dimension in the surface direction of the outermost layer is obtained by calculating and averaging the diameters assuming perfect circles from the area. Here, the projections that are present at an end portion of the image are excluded.

—Occupation Area Ratio of Projections—

From the viewpoints of the scratch resistance of the outer layer and the impressing property, the occupation area ratio of the projections in the surface of the outermost layer is preferably 20% by area or less, more preferably in a range of 0.5% by area to 20% by area, and still more preferably in a range of 1.0% by area to 15% by area.

The occupation area ratio of the projections in the present disclosure is measured according to the following method.

After a carbon or Pt—Pd film is applied to a sample as a conductive treatment such that the thickness thereof is set to 3 nm, a reflection electron image is observed at an acceleration voltage of 5 kV to 10 kV using a SU8010 type FE-SEM (manufactured by Hitachi High-Technologies Corporation). The occupation area ratio of the projections is calculated by performing a binarization processing on an image captured by setting the observation magnification of 1,000 times and N=3 using a difference in contrast between the projections and the surrounding area with image processing software (ImageJ or the like).

—Average Height of Projections—

From the viewpoints of the scratch resistance of the outer layer and the impressing property, the average height of the projections in the surface direction of the outermost layer is preferably in a range of 0.1 μm to 45 μm, more preferably greater than 0.7 μm and less than or equal to 30 μm, and still more preferably in a range of 1.0 μm to 25 μm.

The average height of the projections in the present disclosure is measured according to the following method.

In order to easily distinguish the projections on the surface from the image recording layer, a sample stained with Os (24 hours) is used. Next, a carbon or Pt—Pd film is applied to the sample as a conductive treatment such that the thickness thereof is set to several nm, a surface reflection electron image is observed at an observation magnification of 2,000 times using a Nova 200 type FIB-SEM multi-function machine (manufactured by FEI Company). Next, 10 or more projections on the surface are selected in a descending order of the dimension thereof in the range of the surface reflection electron image thereof, a protective layer for processing is applied using an FIB-SEM multi-function machine, and the center of each projection on the surface thereof is subjected to cross section processing and the cross section reflection electron image is observed. During the observation of the obtained cross section reflection electron image, the distance from the top of the projection on the surface to an intersection between the image recording layer and the line perpendicularly drawn from the top of the projection is defined as the surface projection height. Further, the surface projection heights of the selected projections in which N is 10 or greater are calculated, and the average value thereof is set as the surface projection average height.

—Composition of Projection—

From the viewpoints of the scratch resistance of the outer layer and the impressing property, it is preferable that each projection contains a resin having a melting point of 70° C. to 150° C., more preferable that the projection contains 50% by mass or greater of the resin having a melting point of 70° C. to 150° C. with respect to the total mass of the projections, still more preferable that the projection contains 80% by mass or greater of the resin having melting point of 70° C. to 150° C. with respect to the total mass of the projections, and particularly preferable that the projection contains 90% by mass or greater of the resin having melting point of 70° C. to 150° C. with respect to the total mass of the projections.

Further, from the viewpoints of the scratch resistance of the outer layer and the impressing property, it is preferable that each projection contains at least one resin selected from the group consisting of polyethylene and modified polyethylene, more preferable that the projection contains 50% by mass or greater of at least one resin selected from the group consisting of polyethylene and modified polyethylene with respect to the total mass of the projections, still more preferable that the projection contains 80% by mass or greater of at least one resin selected from the group consisting of polyethylene and modified polyethylene with respect to the total mass of the projections, and particularly preferable that the projection contains 90% by mass or greater of at least one resin selected from the group consisting of polyethylene and modified polyethylene with respect to the total mass of the projections.

Further, it is preferable that the projection contains, as the resin, fluorinated or non-fluorinated polyolefin such as fluorinated or non-fluorinated hydrocarbon containing low-density polyethylene, high-density polyethylene, polypropylene, polytetrafluoroethylene, or a mixture thereof.

Further, from the viewpoints of the scratch resistance of the outer layer and the impressing property, it is preferable that each projection is formed of organic particles having a melting point of 70° C. to 150° C., more preferable that the projection is formed of organic wax particles having a melting point of 70° C. to 150° C., and still more preferable that the projection is formed of high-density or low-density polyethylene particles having a melting point of 70° C. to 150° C.

Suitable examples of the organic wax particles include AQUAMAT 263, AQUAMAT 272, and AQUACER 537 which are commercially available from BYK-Chemie Japan K. K.

The volume average particle diameter of the particles used for forming the projections is preferably in a range of 0.1 µm to 90 µm, more preferably greater than 0.7 µm and less than or equal to 60 µm, and still more preferably in a range of 1.0 µm to 50 µm.

In the present disclosure, the volume average particle diameter of the particles is calculated according to a laser light scattering method.

—Melting Point of Projections—

The melting point of the projections is in a range of 70° C. to 150° C. From the viewpoints of the scratch resistance of the outer layer and the impressing property, the melting point thereof is preferably in a range of 80° C. to 145° C. and more preferably in a range of 90° C. to 140° C. In a case where the melting point of the projections is in a range of 70° C. to 150° C., the projections are melted due to heat generated from friction caused by scratching, the scratched portion slips because of the melting so that the shearing stress is dispersed, and thus the scratch resistance of the outer layer becomes excellent. In a case where the melting point of the projections is in a range of 70° C. to 150° C., since the projections become soft, the impressing property is not almost affected.

The method of measuring the melting point of the projections in the present disclosure is measured according to the following method.

The melting point thereof is measured by collecting projections using a differential scanning calorimetry (DSC) device (Q2000) (manufactured by TA Instruments, Inc.) in a temperature range of −30° C. to 170° C. at a temperature increase rate of 10 mm/min using an aluminum pan.

<Support>

The lithographic printing plate precursor according to the embodiment of the present disclosure has a support.

As the support used in the lithographic printing plate precursor according to the embodiment of the present disclosure, a known support is used.

Further, as the support used in the lithographic printing plate precursor according to the embodiment of the present disclosure, an aluminum support is preferable, and a hydrophilized aluminum support is more preferable.

Among examples, an aluminum plate which has been subjected to an anodizing treatment is more preferable and an aluminum plate which has been subjected to a roughening treatment and an anodizing treatment is particularly preferable.

The roughening treatment and the anodizing treatment can be performed according to known methods.

The aluminum plate can be subjected to a treatment appropriately selected from an expansion treatment or a sealing treatment of micropores of an anodized film described in JP2001-253181A or JP2001-322365A or a surface hydrophilization treatment using alkali metal silicate described in U.S. Pat. Nos. 2,714,066A, 3,181,461A, 3,280,734A, and 3,902,734A or polyvinyl phosphonic acid described in U.S. Pat. Nos. 3,276,868A, 4,153,461A, and 4,689,272A as necessary.

The center line average roughness Ra of the support is preferably in a range of 0.10 µm to 1.2 µm.

The rear surface of the support may be provided with an organic polymer compound described in JP1993-045885A (JP-H05-045885A) and a back coat layer containing an alkoxy compound of silicon described in JP1994-035174A (JP-H06-035174A) as necessary.

<Image Recording Layer>

The lithographic printing plate precursor according to the embodiment of the present disclosure has an image recording layer on a support.

The image recording layer in the present disclosure may be a positive type image recording layer or a negative type image recording layer, but a negative type image recording layer is preferable.

Further, it is preferable that the image recording layer in the present disclosure is an image recording layer according to any of the following first to fifth aspects.

First aspect: The image recording layer contains an infrared absorbent, a polymerizable compound, and a polymerization initiator.

Second aspect: The image recording layer contains an infrared absorbent and thermoplastic polymer particles.

Third aspect: In the first aspect, the image recording layer further contains polymer particles or a microgel.

Fourth aspect: In the first aspect, the image recording layer further contains thermoplastic polymer particles.

Fifth aspect: In the fourth aspect, the image recording layer further contains a microgel.

According to the first aspect or the second aspect, it is possible to obtain a lithographic printing plate precursor from which a lithographic printing plate having excellent printing durability is obtained.

According to the third aspect, it is possible to obtain a lithographic printing plate precursor having excellent on-press developability.

According to the fourth aspect, it is possible to obtain a lithographic printing plate precursor having further excellent printing durability.

According to the fifth aspect, it is possible to obtain a lithographic printing plate precursor having further excellent printing durability.

Further, as the positive type image recording layer, a known image recording layer can be used.

According to a preferable aspect of the lithographic printing plate precursor according to the embodiment of the present disclosure, the image recording layer is an image recording layer (hereinafter, also referred to as an "image recording layer A") containing an infrared absorbent, a polymerization initiator, a polymerizable compound, and a binder polymer.

According to another preferable aspect of the lithographic printing plate precursor according to the embodiment of the present disclosure, the image recording layer is an image recording layer (hereinafter, also referred to as an "image recording layer B") containing an infrared absorbent, a polymerization initiator, a polymerizable compound, and a polymer compound having a particle shape.

According to a still another preferable aspect of the lithographic printing plate precursor according to the embodiment of the present disclosure, the image recording layer is an image recording layer (hereinafter, also referred to as an "image recording layer C") containing an infrared absorbent and thermoplastic polymer particles.

—Image Recording Layer A—

The image recording layer A contains an infrared absorbent, a polymerization initiator, a polymerizable compound, and a binder polymer. Hereinafter, the constituent components of the image recording layer A will be described.

<<Infrared Absorbent>>

An infrared absorbent has a function of converting absorbed infrared rays into heat and a function of transferring electrons or energy or transferring both electrons and energy to a polymerization initiator described below through excitation by infrared rays. As the infrared absorbent used in the present disclosure, a dye or a pigment having maximum absorption at a wavelength of 760 nm to 1,200 nm is preferable and a dye having maximum absorption at a wavelength of 760 nm to 1,200 nm is more preferable.

As the dye, dyes described in paragraphs 0082 to 0088 of JP2014-104631A can be used.

The average particle diameter of the pigment is preferably in a range of 0.01 µm to 1 µm and more preferably in a range of 0.01 µm to 0.5 µm. A known dispersion technique used to produce inks or toners can be used for dispersion of the pigment. The details are described in "Latest Pigment Application Technology" (CMC Publishing Co., Ltd., 1986) and the like.

The infrared absorbent may be used alone or in combination of two or more kinds thereof.

The content of the infrared absorbent is preferably in a range of 0.05% by mass to 30% by mass, more preferably in a range of 0.1% by mass to 20% by mass, and particularly preferably in a range of 0.2% by mass to 10% by mass with respect to the total mass of the image recording layer.

<<Polymerization Initiator>>

The polymerization initiator indicates a compound that initiates and promotes polymerization of a polymerizable compound. As the polymerization initiator, a known thermal polymerization initiator, a compound having a bond with small bond dissociation energy, or a photopolymerization initiator can be used. Specifically, radical polymerization initiators described in paragraphs 0092 to 0106 of JP2014-104631A can be used.

Preferred examples of compounds in the polymerization initiators include onium salts. Among these, iodonium salts and sulfonium salts are particularly preferable. Specific preferred examples of the compounds in each of the salts are compounds described in paragraphs 0104 to 0106 of JP2014-104631A.

The content of the polymerization initiator is preferably in a range of 0.1% to 50% by mass, more preferably in a range of 0.5% to 30% by mass, and particularly preferably in a range of 0.8% to 20% by mass with respect to the total mass of the image recording layer. When the content thereof is in the above-described range, improved sensitivity and improved stain resistance of a non-image portion at the time of printing are obtained.

<<Polymerizable Compound>>

A polymerizable compound is an addition polymerizable compound having at least one ethylenically unsaturated bond, and is preferably selected from compounds having at least one, more preferably two or more, terminal ethylenically unsaturated bonds. These have chemical forms such as a monomer, a pre-polymer, that is, a dimer, a trimer, an oligomer, and a mixture of these. Specifically, polymerizable compounds described in paragraphs 0109 to 0113 of JP2014-104631A can be used.

Among the examples described above, from the viewpoint that the balance between hydrophilicity associated with on-press developability and polymerization ability associated with printing durability is excellent, isocyanuric acid ethylene oxide-modified acrylates such as tris(acryloyloxyethyl) isocyanurate and bis(acryloyloxyethyl)hydroxyethyl isocyanurate are particularly preferable.

The details of the structures of these polymerizable compounds, whether to be used alone or in combination, and the usage method such as the addition amount can be arbitrarily set according to the final performance design of a lithographic printing plate precursor. The content of the above-described polymerizable compound to be used is preferably in a range of 5% by mass to 75% by mass, more preferably in a range of 10% by mass to 70% by mass, and particularly preferably in a range of 15% by mass to 60% by mass with respect to the total mass of the image recording layer.

<Binder Polymer>

A binder polymer can be mainly used to improve the film hardness of the image recording layer. As the binder polymer, known polymers of the related art can be used and polymers having coated-film properties are preferable. Among examples thereof, an acrylic resin, a polyvinyl acetal resin, and a polyurethane resin are preferable.

Preferred examples of the binder polymers include polymers having a cross-linking functional group in the main chain or side chain, preferably in the side chain, for improving coated-film strength of an image portion as described in JP2008-195018A. Cross-linking occurs between polymer molecules by a cross-linking group so that curing is promoted.

Preferred examples of the cross-linking functional group include an ethylenically unsaturated group such as a (meth) acryl group, a vinyl group, an allyl group, or a styryl group (vinyl group bonded to a benzene ring) and an epoxy group, and the cross-linking functional group can be introduced into a polymer by a polymer reaction or copolymerization. For example, a reaction between an acrylic polymer having a carboxy group in the side chain thereof or polyurethane and glycidyl methacrylate or a reaction between a polymer having an epoxy group and ethylenically unsaturated group-containing carboxylic acid such as methacrylic acid can be used.

The content of the cross-linking group in the binder polymer is preferably in a range of 0.1 to 10.0 mmol, more preferably in a range of 0.25 to 7.0 mmol, and particularly preferably in a range of 0.5 to 5.5 mmol with respect to 1 g of the binder polymer.

Moreover, it is preferable that the binder polymer includes a hydrophilic group. The hydrophilic group contributes to imparting on-press developability to the image recording layer. Particularly, in the coexistence of a cross-linking group and a hydrophilic group, both of printing durability and on-press developability can be achieved.

Examples of the hydrophilic group include a hydroxy group, a carboxy group, an alkylene oxide structure, an amino group, an ammonium group, an amide group, a sulfo group, and a phosphoric acid group. Among these, an alkylene oxide structure having 1 to 9 alkylene oxide units having 2 or 3 carbon atoms is preferable. A monomer having a hydrophilic group may be copolymerized in order to impart a hydrophilic group to a binder polymer.

In addition, in order to control the impressing property, a lipophilic group such as an alkyl group, an aryl group, an aralkyl group, or an alkenyl group can be introduced into the binder polymer. For example, a lipophilic group-containing monomer such as methacrylic acid alkyl ester may be copolymerized.

The weight-average molecular weight (Mw) of the binder polymer is preferably 2,000 or greater, more preferably 5,000 or greater, and still more preferably in a range of 10,000 to 300,000.

The content of the binder polymer is preferably in a range of 3% by mass to 90% by mass, more preferably in a range of 5% by mass to 80% by mass, and still more preferably in a range of 10% by mass to 70% by mass with respect to the total mass of the image recording layer.

As a preferred example of the binder polymer, a polymer compound having a polyoxyalkylene chain in the side chain is exemplified. When the image recording layer contains a polymer compound having a polyoxyalkylene chain in the side chain (hereinafter, also referred to as a "POA chain-containing polymer compound"), permeability of dampening water is promoted and on-press developability is improved.

Examples of the resin constituting the main chain of the POA chain-containing polymer compound include an acrylic resin, a polyvinyl acetal resin, a polyurethane resin, a polyurea resin, a polyimide resin, a polyamide resin, an epoxy resin, a methacrylic resin, a polystyrene resin, a novolac type phenolic resin, a polyester resin, synthetic rubber, and natural rubber. Among these, an acrylic resin is particularly preferable.

Further, in the present disclosure, a "main chain" indicates relatively the longest bonding chain in a molecule of a polymer compound constituting a resin and a "side chain" indicates a branched chain branched from the main chain.

The POA chain-containing polymer compound does not substantially contain a perfluoroalkyl group. The expression "does not substantially contain a perfluoroalkyl group" means that the mass ratio of a fluorine atom present as a perfluoroalkyl group in a polymer compound is less than 0.5% by mass, and it is preferable that the polymer compound does not contain a fluorine atom. The mass ratio of the fluorine atom is measured by an elemental analysis method.

In addition, the "perfluoroalkyl group" is a group in which all hydrogen atoms of the alkyl group are substituted with fluorine atoms.

As alkylene oxide (oxyalkylene) in a polyoxyalkylene chain, alkyleneoxide having 2 to 6 carbon atoms (also referred to as "number of carbon atoms") is preferable, ethyleneoxide (oxyethylene) or propyleneoxide (oxypropylene) is more preferable, and ethyleneoxide is still more preferable.

The repetition number of the alkyleneoxide in a polyoxyalkylene chain, that is, a polyalkyleneoxide moiety is preferably in a range of 2 to 50 and more preferably in a range of 4 to 25.

When the repetition number of the alkyleneoxide is 2 or greater, the permeability of dampening water is sufficiently improved. Further, from the viewpoint that a degradation of printing durability is suppressed due to abrasion, it is preferable that the repetition number thereof is 50 or less.

As the polyalkyleneoxide moiety, structures described in paragraphs 0060 to 0062 of JP2014-104631A are preferable.

The POA chain-containing polymer compound may have cross-linking properties in order to improve coated-film strength of an image portion. Examples of the POA chain-containing polymer compounds having cross-linking properties are described in paragraphs 0063 to 0072 of JP2014-104631A.

The proportion of repeating units having a polyalkyleneoxide moiety in the total repeating units constituting the POA chain-containing polymer compound is not particularly limited, but is preferably in a range of 0.5 mol % to 80 mol % and more preferably in a range of 0.5 mol % to 50 mol %. Specific examples of the POA chain-containing polymer compounds are described in paragraphs 0075 and 0076 of JP2014-104631A.

As the POA chain-containing polymer compound, hydrophilic polymer compounds such as polyacrylic acid and polyvinyl alcohol described in JP2008-195018A can be used in combination as necessary. Further, a lipophilic polymer compound and a hydrophilic polymer compound can be used in combination.

In addition to the presence of the POA chain-containing polymer compound in the image recording layer as a binder that plays a role of connecting image recording layer components with each other, the specific polymer compound may be present in the form of particles. In a case where the specific polymer compound is present in the form of particles, the average particle diameter is in a range of 10 nm to 1,000 nm, preferably in a range of 20 nm to 300 nm, and particularly preferably in a range of 30 nm to 120 nm.

The content of the POA chain-containing polymer compound is preferably in a range of 3% by mass to 90% by mass and more preferably in a range of 5% by mass to 80% by mass with respect to the total mass of the image recording layer. When the content thereof is in the above-described range, both of permeability of dampening water and image formability can be reliably achieved.

Other preferred examples of the binder polymer include a polymer compound (hereinafter, also referred to as a "star type polymer compound") which has a polymer chain bonded to a nucleus through a sulfide bond by means of using a polyfunctional, in a range of hexa- to deca-functional, thiol as the nucleus and in which the polymer chain has a polymerizable group. As the star type polymer compound, for example, compounds described in JP2012-148555A can be preferably used.

Examples of the star type polymer compound include compounds having a polymerizable group such as an ethylenically unsaturated bond in the main chain or in the side chain, preferably in the side chain, for improving coated-film strength of an image portion as described in JP2008-195018A. Cross-linking occurs between polymer molecules by a polymerizable group so that curing is promoted.

Preferred examples of the polymerizable group include an ethylenically unsaturated group such as a (meth)acryl group, a vinyl group, an allyl group, or a styryl group and an epoxy group. Among these, from the viewpoint of polymerization reactivity, a (meth)acryl group, a vinyl group, or a styryl group is more preferable and a (meth)acryl group is particularly preferable. These groups can be introduced into a polymer by a polymer reaction or copolymerization. For example, a reaction between a polymer having a carboxy group in the side chain thereof and glycidyl methacrylate or a reaction between a polymer having an epoxy group and ethylenically unsaturated group-containing carboxylic acid such as methacrylic acid can be used. These groups may be used in combination.

The content of the cross-linking group in the star type polymer compound is preferably in a range of 0.1 mmol to 10.0 mmol, more preferably in a range of 0.25 mmol to 7.0 mmol, and particularly preferably in a range of 0.5 mmol to 5.5 mmol with respect to 1 g of the star type polymer compound.

Moreover, it is preferable that the star type polymer compound further includes a hydrophilic group. The hydrophilic group contributes to imparting on-press developability to the image recording layer. Particularly, in the coexistence of a polymerizable group and a hydrophilic group, both of printing durability and developability can be achieved.

Examples of the hydrophilic group include —$SO_3M^1$, —OH, —$CONR^1R^2$ ($M^1$ represents a hydrogen atom, a metal ion, an ammonium ion, or a phosphonium ion, $R^1$ and $R^2$ each independently represent a hydrogen atom, an alkyl group, an alkenyl group, or an aryl group, and $R^1$ and $R^2$ may be bonded to each other to form a ring), $—N^+R^3R^4R^5X^-$ ($R^3$ to $R^5$ each independently represent an alkyl group having 1 to 8 carbon atoms and $X^-$ represents a counter anion), $—(CH_2CH_2O)_nR$, and $—(C_3H_6O)_mR$.

In the above-described formulae, n and m each independently represent an integer of 1 to 100 and R's each independently represent a hydrogen atom or an alkyl group having 1 to 18 carbon atoms.

Here, in a case where the star type polymer compound is a star type polymer compound having a polyoxyalkylene chain (for example, $—(CH_2CH_2O)_nR$ and $—(C_3H_6O)_mR$) in the side chain, such a star type polymer compound is a polymer compound having the above-described polyoxyalkylene chain in the side chain.

Among these hydrophilic groups, $—CONR^1R^2$, $—(CH_2CH_2O)_nR$, or $—(C_3H_6O)_mR$ is preferable, $—CONR^1R^2$ or $—(CH_2CH_2O)_nR$ is more preferable, and $—(CH_2CH_2O)_nR$ is particularly preferable. In $—(CH_2CH_2O)_nR$, n represents an integer of preferably 1 to 10 and particularly preferably 1 to 4. Further, R represents more preferably a hydrogen atom or an alkyl group having 1 to 4 carbon atoms and particularly preferably a hydrogen atom or a methyl group. These hydrophilic groups may be used in combination of two or more kinds thereof.

Further, it is preferable that the star type polymer compound does not substantially include a carboxylic acid group, a phosphoric acid group, or a phosphonic acid group. Specifically, the amount of these acid groups is preferably less than 0.1 mmol/g, more preferably less than 0.05 mmol/g, and particularly preferably 0.03 mmol/g or less. When the amount of these acid groups is less than 0.1 mmol/g, developability is further improved.

In order to control the impressing property, a lipophilic group such as an alkyl group, an aryl group, an aralkyl group, or an alkenyl group can be introduced into the star type polymer compound. Specifically, a lipophilic group-containing monomer such as methacrylic acid alkyl ester may be copolymerized.

Specific examples of the star type polymer compound include compounds described in paragraphs 0153 to 0157 of JP2014-104631A.

The star type polymer compound can be synthesized, using a known method, by performing radical polymerization on the above-described monomers constituting a polymer chain in the presence of the above-described polyfunctional thiol compound.

The weight-average molecular weight of the star type polymer compound is preferably in a range of 5,000 to 500,000, more preferably in a range of 10,000 to 250,000, and particularly preferably in a range of 20,000 to 150,000. When the weight-average molecular weight thereof is in the above-described range, the on-press developability and the printing durability are more improved.

The star type polymer compound may be used alone or in combination of two or more kinds thereof. Further, the star type polymer compound may be used in combination with a typical linear binder polymer.

The content of the star type polymer compound is preferably in a range of 5% by mass to 95% by mass, more preferably in a range of 10% by mass to 90% by mass, and particularly preferably in a range of 15% by mass to 85% by mass with respect to the total mass of the image recording layer.

From the viewpoint of promoting the permeability of dampening water and improving the on-press developability, star type polymer compounds described in JP2012-148555A are particularly preferable.

<<Other Components>>

The image recording layer A can contain other components described below as necessary.

(1) Low-Molecular Weight Hydrophilic Compound

In order to improve the on-press developability without degrading the printing durability, the image recording layer may contain a low-molecular weight hydrophilic compound.

As the low-molecular weight hydrophilic compound, examples of a water-soluble organic compound include glycols such as ethylene glycol, diethylene glycol, triethylene glycol, propylene glycol, dipropylene glycol, and tripropylene glycol and ether or ester derivatives thereof; polyols such as glycerin, pentaerythritol, and tris(2-hydroxyethyl) isocyanurate; organic amines such as triethanolamine, diethanolamine, and monoethanolamine and salts thereof; organic sulfonic acids such as alkylsulfonic acid, toluenesulfonic acid, and benzenesulfonic acid and salts thereof; organic sulfamic acids such as alkyl sulfamic acid and salts thereof; organic sulfuric acids such as alkyl sulfuric acid and alkyl ether sulfuric acid and salts thereof; organic phosphonic acids such as phenyl phosphonic acid and salts thereof; organic carboxylic acids such as tartaric acid, oxalic acid, citric acid, malic acid, lactic acid, gluconic acid, and amino acids and salts thereof; and betaines.

Among these, it is preferable that the image recording layer contains at least one compound selected from the group consisting of polyols, organic sulfates, organic sulfonates, and betaines.

Specific examples of the compounds of the organic sulfonates include compounds described in paragraphs 0026 to 0031 of JP2007-276454A and paragraphs 0020 to 0047 of JP2009-154525A. The salt may be potassium salt or lithium salt.

Examples of the organic sulfates include compounds described in paragraphs 0034 to 0038 of JP2007-276454A.

As betaines, compounds having 1 to 5 carbon atoms of hydrocarbon substituents to nitrogen atoms are preferable. Specific examples thereof include trimethyl ammonium acetate, dimethyl propyl ammonium acetate, 3-hydroxy-4-trimethyl ammonio butyrate, 4-(1-pyridinio)butyrate, 1-hydroxyethyl-1-imidazolioacetate, trimethyl ammonium methane sulfonate, dimethyl propyl ammonium methane sulfonate, 3-trimethylammonio-1-propane sulfonate, and 3-(1-pyridinio)-1-propane sulfonate.

Since the low-molecular weight hydrophilic compound has a small structure of a hydrophobic portion, hydrophobicity or coated-film strength of an image portion is not degraded by dampening water permeating into an image recording layer exposed portion (image portion) and ink receptivity or printing durability of the image recording layer can be maintained satisfactorily.

The addition amount of the low-molecular weight hydrophilic compound is preferably in a range of 0.5% by mass to 20% by mass, more preferably in a range of 1% by mass to 15% by mass, and still more preferably in a range of 2% by mass to 10% by mass with respect to the total mass of the image recording layer. When the amount thereof is in the above-described range, excellent on-press developability and printing durability can be obtained.

The low-molecular weight hydrophilic compound may be used alone or in combination of two or more kinds thereof.

(2) Oil Sensitizing Agent

In order to improve the impressing property, an oil sensitizing agent such as a phosphonium compound, a nitrogen-containing low-molecular weight compound, or an ammonium group-containing polymer can be used for the image recording layer. Particularly, in a case where a protective layer contains an inorganic layered compound, the above-described compounds function as a surface coating agent of the inorganic layered compound and prevent a degradation in impressing property due to the inorganic layered compound during the printing.

The phosphonium compound, the nitrogen-containing low-molecular weight compound, and the ammonium group-containing polymer are described in paragraphs 0184 to 0190 of JP2014-104631A in detail.

The content of the oil sensitizing agent is preferably in a range of 0.01% by mass to 30.0% by mass, more preferably in a range of 0.1% by mass to 15.0% by mass, and still more preferably in a range of 1% by mass to 10% by mass with respect to the total mass of the image recording layer.

(3) Other Components

The image recording layer may further contain other components such as a surfactant, a coloring agent, a printing-out agent, a polymerization inhibitor, a higher fatty acid derivative, a plasticizer, inorganic particles, an inorganic layered compound, a co-sensitizer, and a chain transfer agent. Specifically, the compounds and the addition amounts described in paragraphs 0114 to 0159 of JP2008-284817A, paragraphs 0023 to 0027 of JP2006-091479A, and paragraph 0060 of US2008/0311520A can be preferably used.

<<Formation of Image Recording Layer A>>

The image recording layer A is formed by dispersing or dissolving each of the above-described required components in a known solvent to prepare a coating solution, coating a support with the coating solution directly or through an undercoat layer using a known method such as a bar coater coating method, and drying the resultant, as described in paragraphs 0142 and 0143 of JP2008-195018A. The coating amount of the image recording layer (solid content) on the support to be obtained after the coating and the drying varies depending on the applications thereof, but is preferably in a range of 0.3 $g/m^2$ to 3.0 $g/m^2$. When the coating amount thereof is in the above-described range, excellent sensitivity and excellent film-coating characteristics of the image recording layer are obtained.

—Image Recording Layer B—

The image recording layer B contains an infrared absorbent, a polymerization initiator, a polymerizable compound, and a polymer compound having a particle shape. Hereinafter, the constituent components of the image recording layer B will be described.

Similarly, the infrared absorbent, the polymerization initiator, and the polymerizable compound described in the image recording layer A can be used as an infrared absorbent, a polymerization initiator, and a polymerizable compound in the image recording layer B.

<<Polymer Compound Having Particle Shape>>

It is preferable that the polymer compound having a particle shape is selected from the group consisting of thermoplastic polymer particles, thermally reactive polymer particles, polymer particles having a polymerizable group, a microcapsule encapsulating a hydrophobic compound, and a microgel (cross-linked polymer particles). Among these, polymer particles having a polymerizable group and a microgel are preferable. According to a particularly preferred embodiment, the polymer compound having a particle shape includes at least one ethylenically unsaturated polymerizable group. Because of the presence of the polymer compound having a particle shape, effects of improving the printing durability of an exposed portion and the on-press developability of an unexposed portion are obtained.

Further, it is preferable that the polymer compound having a particle shape is thermoplastic polymer particles.

Preferred examples of the thermoplastic polymer particles include thermoplastic polymer particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of a polymer constituting thermoplastic polymer particles include homopolymers or copolymers of monomers such as acrylate or methacrylate having structures of ethylene, styrene, vinyl chloride, methyl acrylate, ethyl acrylate, methyl methacrylate, ethyl methacrylate, vinylidene chloride, acrylonitrile, vinyl carbazole, and polyalkylene, and mixtures of these. Among these, polystyrene, a copolymer obtained by copolymerizing at least styrene and acrylonitrile, and polymethyl methacrylate are more preferable. The average particle diameter of the thermoplastic polymer particles is preferably in a range of 0.01 µm to 3.0 µm.

Examples of the thermally reactive polymer particles include polymer particles having a thermally reactive group. The thermally reactive polymer particles are cross-linked by a thermal reaction and have hydrophobic regions formed by a change in functional groups during the cross-linking.

As the thermally reactive group in polymer particles having a thermally reactive group, a functional group that performs any reaction may be used as long as a chemical bond is formed, but a polymerizable group is preferable. Preferred examples of the polymerizable group include an ethylenically unsaturated group that performs a radical polymerization reaction (such as an acryloyl group, a methacryloyl group, a vinyl group, or an allyl group); a cationic polymerizable group (such as a vinyl group, a vinyloxy group, an epoxy group, or an oxetanyl group); an isocyanate group that performs an addition reaction or a block body thereof, an epoxy group, a vinyloxy group, and a functional group having active hydrogen atom as a reaction partner of these (such as an amino group, a hydroxy group, or a carboxy group); a carboxy group that performs a condensation reaction and a hydroxy group or an amino group as a reaction partner thereof; and an acid anhydride that performs a ring-opening addition reaction and an amino group or a hydroxy group as a reaction partner thereof.

The microcapsule is a microcapsule in which at least a part of constituent components of the image recording layer is encapsulated as described in JP2001-277740A and JP2001-277742A. Further, the constituent components of the image recording layer may be contained in a portion other than the microcapsule. Moreover, a preferred embodiment of the image recording layer containing the microcapsule is an embodiment in which hydrophobic constituent components are encapsulated in a microcapsule and hydrophilic constituent components are contained in a portion other than the microcapsule.

The microgel (cross-linked polymer particles) may contain a part of the constituent components of the image recording layer in at least one of the surface or the inside of the microgel. From the viewpoints of image forming sensitivity and printing durability, a reactive microgel having a radical polymerizable group on the surface thereof is particularly preferable.

The constituent components of the image recording layer can be made into microcapsules or microgels using a known method.

From the viewpoints of the printing durability, stain resistance, and storage stability, it is preferable that the polymer compound having a particle shape is obtained by reacting a polyvalent isocyanate compound which is an adduct of a polyhydric phenol compound containing two or more hydroxy groups in a molecule and isophorone diisocyanate with a compound containing an active hydrogen.

As the polyhydric phenol compound, a compound having a plurality of benzene rings containing a phenolic hydroxy group is preferable.

As the compound containing an active hydrogen, a polyol compound or a polyamine compound is preferable, a polyol compound is more preferable, and at least one compound selected from the group consisting of propylene glycol, glycerin, and trimethylolpropane is still more preferable.

As the resin particles obtained by reacting the compound containing an active hydrogen with the polyvalent isocyanate compound which is an adduct of a polyhydric phenol compound containing two or more hydroxy groups in a molecule and isophorone diisocyanate, polymer particles described in paragraphs 0032 to 0095 of JP2012-206495A are preferably exemplified.

Further, from the viewpoints of the printing durability and the solvent resistance, it is preferable that the polymer compound having a particle shape has a hydrophobic main chain and both of a constitutional unit (i) which contains a pendant-cyano group directly bonded to the hydrophobic main chain and a constitutional unit (ii) which contains a pendant group having a hydrophilic polyalkylene oxide segment.

Preferred examples of the hydrophobic main chain include an acrylic resin chain.

Preferred examples of the pendant-cyano group include —[CH$_2$CH(C≡N)]— and —[CH$_2$C(CH$_3$)(C≡N)]—.

Further, the constitutional unit having a pendant-cyano group can be easily derived from an ethylene-based unsaturated monomer such as acrylonitrile or methacrylonitrile or a combination of these.

Further, as the alkylene oxide in the hydrophilic polyalkylene oxide segment, ethylene oxide or propylene oxide is preferable and ethylene oxide is more preferable.

The repetition number of alkylene oxide structures in the hydrophilic polyalkylene oxide segment is preferably in a range of 10 to 100, more preferably in a range of 25 to 75, and still more preferably in a range of 40 to 50.

As the resin particles which have a hydrophobic main chain and both of a constitutional unit (i) containing a pendant-cyano group directly bonded to the hydrophobic main chain and a constitutional unit (ii) containing a pendant group having a hydrophilic polyalkylene oxide segment, those described in paragraphs 0039 to 0068 of JP2008-503365A are preferably exemplified.

The average particle diameter of the polymer compound having a particle shape is preferably in a range of 0.01 μm to 3.0 more preferably in a range of 0.03 μm to 2.0 μm, and still more preferably in a range of 0.10 μm to 1.0 μm. When the average particle diameter thereof is in the above-described range, excellent resolution and temporal stability are obtained.

The content of the polymer compound having a particle shape is preferably in a range of 5% by mass to 90% by mass with respect to the total mass of the image recording layer.

<<Other Components>>

The image recording layer B can contain the other components described in the above-described image recording layer A as necessary.

<Formation of Image Recording Layer B>

The image recording layer B can be formed in the same manner as the image recording layer A described above.

—Image Recording Layer C—

The image recording layer C contains an infrared absorbent and thermoplastic polymer particles. Hereinafter, the constituent components of the image recording layer C will be described.

<<Infrared Absorbent>>

The infrared absorbent contained in the image recording layer C is a dye or a pigment having maximum absorption at a wavelength in a range of 760 nm to 1,200 nm. A dye having maximum absorption at a wavelength in a range of 760 nm to 1,200 nm is more preferable.

As the dye, commercially available dyes and known dyes described in the literatures (for example, "Dye Handbook" edited by The Society of Synthetic Organic Chemistry, Japan, published in 1970, "Near-Infrared Absorbing Coloring agent" of "Chemical Industry", pages. 45 to 51, published in May, 1986, and "Development and Market Trend of Functional Dyes in 1990's" Section 2.3 of Chapter 2 (CMC Publishing Co., Ltd., published in 1990)) and the patents can be used. Specific preferred examples thereof include infrared absorbing dyes such as an azo dye, a metal complex salt azo dye, a pyrazolone azo dye, an anthraquinone dye, a phthalocyanine dye, a carbonium dye, a quinone imine dye, a polymethine dye, and a cyanine dye.

Among these, infrared absorbing dyes having a water-soluble group are particularly preferable from the viewpoint of addition to the image recording layer C.

Specific examples of the infrared absorbing dyes are described below, but the present disclosure is not limited thereto.

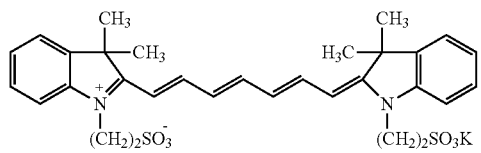

(IR-1)

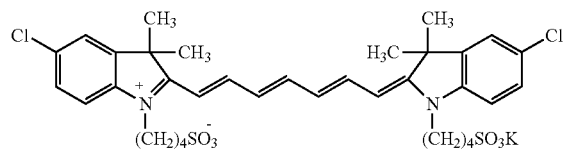

(IR-2)

-continued

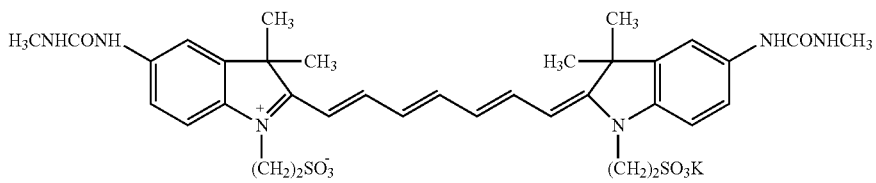
(IR-3)

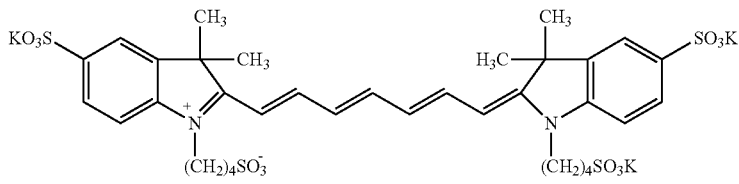
(IR-4)

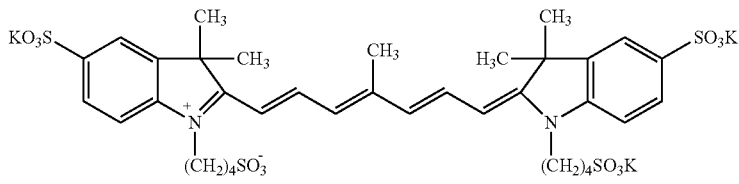
(IR-5)

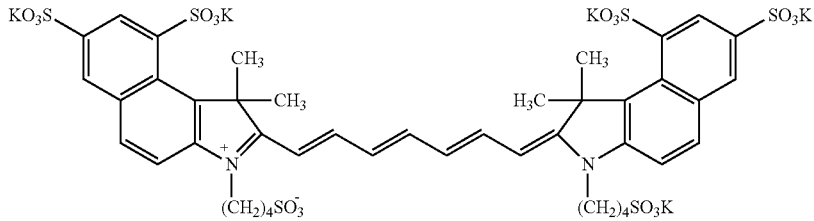
(IR-6)

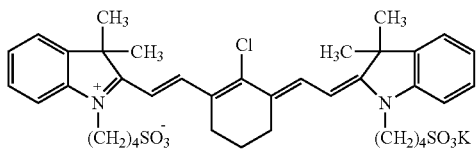
(IR-7)

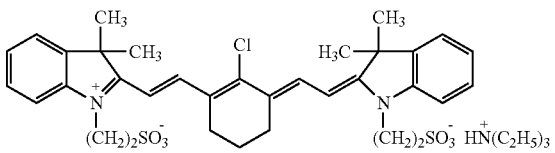
(IR-8)

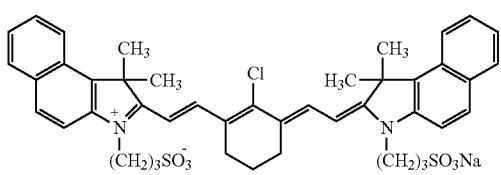
(IR-9)

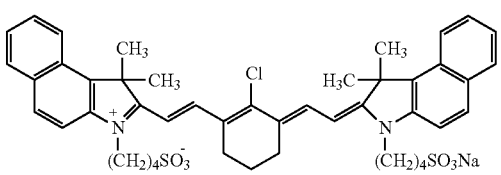
(IR-10)

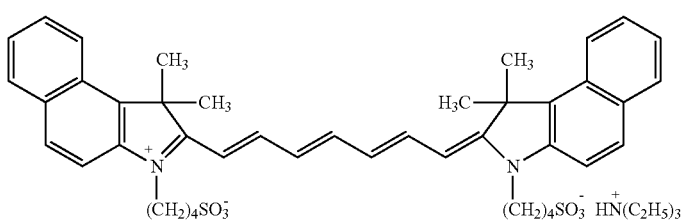
(IR-11)

As the pigments, commercially available pigments and pigments described in Color Index (C. I.) Handbook, "Latest Pigment Handbook" (edited by Japan Pigment Technology Association, published in 1977), "Latest Pigment Application Technology" (CMC Publishing Co., Ltd., published in 1986), and "Printing Ink Technology" (CMC Publishing Co., Ltd., published in 1984) can be used.

The particle diameter of the pigment is preferably in a range of 0.01 µm to 1 µm and more preferably in a range of 0.01 µm to 0.5 µm. A known dispersion technique used to produce inks or toners can be used as a method of dispersing the pigment. The details are described in "Latest Pigment Application Technology" (CMC Publishing Co., Ltd., published in 1986).

The content of the infrared absorbent is preferably in a range of 0.1% by mass to 30% by mass, more preferably in a range of 0.25% by mass to 25% by mass, and particularly preferably in a range of 0.5% by mass to 20% by mass with respect to the total mass of the image recording layer. When the content thereof is in the above-described range, excellent sensitivity is obtained without damaging the film hardness of the image recording layer.

<<Thermoplastic Polymer Particles>>

The glass transition temperature (Tg) of the thermoplastic polymer particles is preferably in a range of 60° C. to 250° C. Tg of the thermoplastic polymer particles is more preferably in a range of 70° C. to 140° C. and still more preferably in a range of 80° C. to 120° C.

Preferred examples of the thermoplastic polymer particles having a Tg of 60° C. or higher include thermoplastic polymer particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples thereof include homopolymers or copolymers formed of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures of these. Among these, polystyrene, a copolymer containing styrene and acrylonitrile, and polymethylmethacrylate are preferable.

The average particle diameter of the thermoplastic polymer particles is preferably in a range of 0.005 µm to 2.0 µm from the viewpoints of resolution and temporal stability. This value is used as the average particle diameter in a case where two or more kinds of thermoplastic polymer particles are mixed with each other. The average particle diameter thereof is more preferably in a range of 0.01 µm to 1.5 µm and particularly preferably in a range of 0.05 µm to 1.0 µm. The polydispersity in a case where two or more kinds of thermoplastic polymer particles are mixed with each other is preferably 0.2 or greater.

In the present disclosure, the average particle diameter and the polydispersity are calculated according to a laser light scattering method.

The thermoplastic polymer particles may be used in combination of two or more kinds thereof. Specifically, at least two kinds of thermoplastic polymer particles with different particle sizes or at least two kinds of thermoplastic polymer particles with different Tg's may be exemplified. When two or more kinds of thermoplastic polymer particles are used in combination, coated-film curing properties of an image portion are further improved and printing durability in a case where a lithographic printing plate is obtained is further improved.

For example, in a case where thermoplastic polymer particles having the same particle size are used, voids are present between the thermoplastic polymer particles to some extent and thus the curing properties of the coated-film are not desirable in some cases even when the thermoplastic polymer particles are melted and solidified by image exposure. Meanwhile, in a case where thermoplastic polymer particles having different particle sizes are used, the void volume between the thermoplastic polymer particles can be decreased and thus the coated-film curing properties of the image portion after image exposure can be improved.

Further, in a case where thermoplastic polymer particles having the same Tg are used, the thermoplastic polymer particles are not sufficiently melted and solidified in some cases when an increase in temperature of the image recording layer resulting from image exposure is insufficient, and thus the curing properties of the coated-film are not desirable. Meanwhile, in a case where thermoplastic polymer particles having different Tg's are used, the coated-film curing properties of the image portion can be improved even in a case where an increase in temperature of the image recording layer resulting from image exposure is insufficient.

In a case where two or more kinds of thermoplastic polymer particles having different Tg's are used in combination, the Tg of at least one thermoplastic polymer particle is preferably 60° C. or higher. At this time, a difference in Tg's is preferably 10° C. or higher and more preferably 20° C. or higher. In addition, the content of the thermoplastic polymer particles having a Tg of 60° C. or higher is 70% by mass or greater with respect to the total amount of all thermoplastic polymer particles.

The thermoplastic polymer particles may include a cross-linking group. When thermoplastic polymer particles having a cross-linking group are used, the cross-linking group is thermally reacted due to heat generated by an image-exposed portion so as to be cross-linked between the polymers, and thus coated-film strength of the image portion is improved and printing durability becomes more excellent. As the cross-linking group, a functional group that performs any reaction may be used as long as a chemical bond is formed, and examples thereof include an ethylenically unsaturated group that performs a polymerization reaction (such as an acryloyl group, a methacryloyl group, a vinyl group, or an allyl group); an isocyanate group that performs an addition reaction or a block body thereof, and a group having active hydrogen atom as a reaction partner of these (such as an amino group, a hydroxy group, or a carboxyl group); an epoxy group that performs an addition reaction and an amino group, a carboxyl group or a hydroxy group as a reaction partner thereof; a carboxyl group that performs a condensation reaction and a hydroxy group or an amino group; and an acid anhydride that performs a ring-opening addition reaction and an amino group or a hydroxy group.

Specific examples of the thermoplastic polymer particles having a cross-linking group include thermoplastic polymer particles having a cross-linking group such as an acryloyl group, a methacryloyl group, a vinyl group, an allyl group, an epoxy group, an amino group, a hydroxy group, a carboxyl group, an isocyanate group, an acid anhydride, and a protecting group of these. These cross-linking groups may be introduced into polymers at the time of polymerization of polymer particles or may be introduced using a polymer reaction after polymerization of the polymer particles.

In a case where a cross-linking group is introduced to a polymer at the time of polymerization of polymer particles, it is preferable that a monomer having a cross-linking group may be subjected to an emulsion polymerization or a suspension polymerization. Specific examples of the monomer having a cross-linking group include allyl methacrylate, allyl acrylate, vinyl methacrylate, vinyl acrylate, glycidyl methacrylate, glycidyl acrylate, 2-isocyanate ethyl methacrylate or a block isocyanate resulting from alcohol thereof, 2-isocyanate ethyl acrylate or a block isocyanate resulting from alcohol thereof, 2-aminoethyl methacrylate, 2-aminoethyl acrylate, 2-hydroxyethyl methacrylate, 2-hydroxyethyl acrylate, acrylic acid, methacrylic acid, maleic acid anhydride, bifunctional acrylate, and bifunctional methacrylate.

Examples of the polymer reaction used in a case where a cross-linking group is introduced after polymerization of polymer particles include polymer reactions described in WO96/034316A.

Polymer particles may react with each other through a cross-linking group or the thermoplastic polymer particles may react with a polymer compound or a low-molecular weight compound added to the image recording layer.

The content of the thermoplastic polymer particles is preferably in a range of 50% by mass to 95% by mass, more preferably in a range of 60% by mass to 90% by mass, and particularly preferably in a range of 70% by mass to 85% by mass with respect to the total mass of the image recording layer.

<<Other Components>>

The image recording layer C may further contain other components as necessary.

Preferred examples of other components include a surfactant having a polyoxyalkylene group or a hydroxy group.

As the surfactant having a polyoxyalkylene group (hereinafter, also referred to as a "POA group") or a hydroxy group, a surfactant having a POA group or a hydroxy group may be suitably used, but an anionic surfactant or a non-ionic surfactant is preferable. Among anionic surfactants or non-ionic surfactants having a POA group or a hydroxy group, anionic surfactants or non-ionic surfactants having a POA group are preferable.

As the POA group, a polyoxyethylene group, a polyoxypropylene group, or a polyoxybutylene group is preferable and a polyoxyethylene group is particularly preferable.

The average degree of polymerization of the oxyalkylene group is preferably 2 to 50 and more preferably 2 to 20.

The number of the hydroxy group is preferably 1 to 10 and more preferably 2 to 8. Here, the number of terminal hydroxy groups in the oxyalkylene group is not included in the number of hydroxy groups.

The anionic surfactant having a POA group is not particularly limited, and examples thereof include polyoxyalkylene alkyl ether carboxylates, polyoxyalkylene alkyl sulfosuccinates, polyoxyalkylene alkyl ether sulfuric acid ester salts, alkyl phenoxy polyoxyalkylene propyl sulfonates, polyoxyalkylene alkyl sulfophenyl ethers, polyoxyalkylene aryl ether sulfuric acid ester salts, polyoxyalkylene polycyclic phenylether sulfuric acid ester salts, polyoxyalkylene styryl phenyl ether sulfuric acid ester salts, polyoxyalkylene alkyl ether phosphoric acid ester salts, polyoxyalkylene alkyl phenyl ether phosphoric acid ester salts, and polyoxyalkylene perfluoroalkyl ether phosphoric acid ester salts.

The anionic surfactant having a hydroxy group is not particularly limited, and examples thereof include hydroxy carboxylates, hydroxy alkyl ether carboxylates, hydroxy alkane sulfonates, fatty acid monoglyceride sulfuric acid ester salts, and fatty acid monoglyceride acid ester salts.

The content of the surfactant having a POA group or a hydroxy group is preferably in a range of 0.05% by mass to 15% by mass and more preferably in a range of 0.1% by mass to 10% by mass with respect to the total mass of the image recording layer.

Hereinafter, specific examples of the surfactant having a POA group or a hydroxy group will be described, but the present disclosure is not limited thereto. A surfactant A-12 described below is a trade name of Zonyl FSP and available from Dupont. Further, a surfactant N-11 described below is a trade name of Zonyl FSO 100 and available from Dupont. Further, m and n in A-12 each independently represent an integer of 1 or greater.

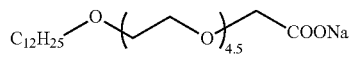

A-1

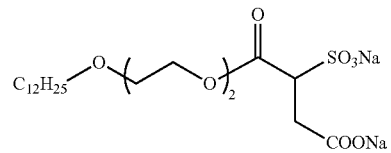

A-2

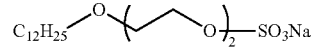

A-3

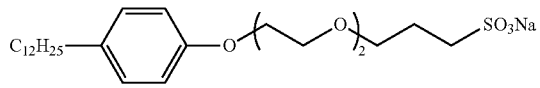

A-4

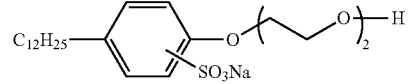

A-5

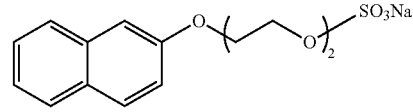

A-6

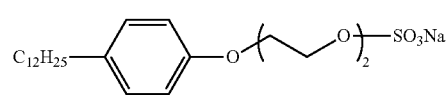

A-7

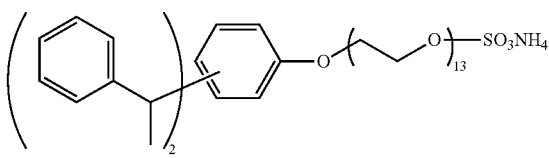

A-8

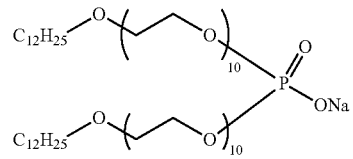

A-9

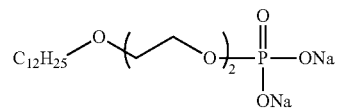

A-10

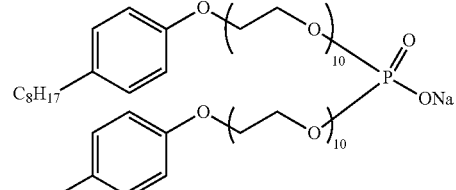

A-11

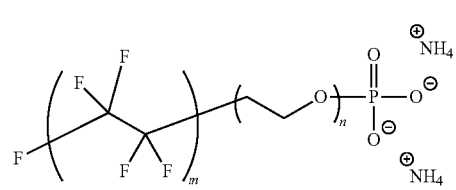

A-12

$C_{10}H_{21}$—CH—$CH_2$—O—$CH_2$—COONa
          |
          OH

A-13

For the purpose of ensuring coating uniformity of the image recording layer, the image recording layer may contain an anionic surfactant that does not have a polyoxyalkylene group or a hydroxy group.

The anionic surfactant is not particularly limited as long as the above-described purpose is achieved. Among the examples of the anionic surfactants, alkyl benzene sulfonic acid or a salt thereof, alkyl naphthalene sulfonic acid or a salt thereof, (di)alkyl diphenyl ether (di)sulfonic acid or a salt thereof, or alkyl sulfuric acid ester salt is preferable.

The addition amount of the anionic surfactant that does not have a polyoxyalkylene group or a hydroxy group is preferably in a range of 1% by mass to 50% by mass and more preferably in a range of 1% by mass to 30% by mass with respect to the total mass of the surfactant which has a polyoxyalkylene group or a hydroxy group.

Hereinafter, specific examples of the anionic surfactant that does not have a polyoxyalkylene group or a hydroxy group will be described, but the present disclosure is not limited thereto.

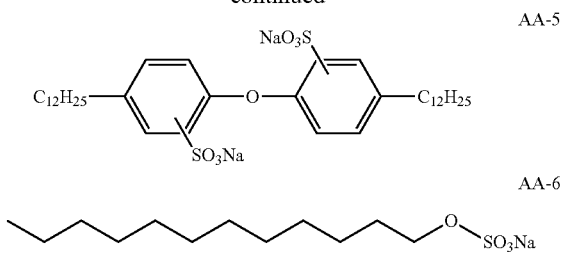

AA-5

AA-6

Further, for the purpose of ensuring coating uniformity of the image recording layer, a non-ionic surfactant that does not have a polyoxyalkylene group or a hydroxy group or a fluorine-based surfactant may be used. For example, fluorine-based surfactants described in JP1987-170950A (JP-S62-170950A) are preferably used.

The image recording layer may contain a hydrophilic resin. Preferred examples of the hydrophilic resin include resins having a hydrophilic group such as a hydroxy group, a hydroxyethyl group, a hydroxypropyl group, an amino group, an aminoethyl group, an aminopropyl group, a carboxy group, a carboxylate group, a sulfo group, a sulfonate group, and a phosphoric acid group.

Specific examples of the hydrophilic resin include gum arabic, casein, gelatin, a starch derivative, carboxy methyl cellulose and sodium salt thereof; cellulose acetate, sodium alginate, vinyl acetate-maleic acid copolymers, styrene-maleic acid copolymers, polyacrylic acids and salts of these, polymethacrylic acids and salts of these, a homopolymer and a copolymer of hydroxyethyl methacrylate, a homopolymer and a copolymer of hydroxyethyl acrylate, a homopolymer and a copolymer of hydroxypropyl methacrylate, a homopolymer and a copolymer of hydroxypropyl acrylate, a homopolymer and a copolymer of hydroxybutyl methacrylate, a homopolymer and a copolymer of hydroxybutyl acrylate, polyethylene glycols, hydroxypropylene polymers, polyvinyl alcohols, hydrolyzed polyvinyl acetate having a degree of hydrolysis of at least 60% and preferably at least 80%, polyvinyl formal, polyvinyl butyral, polyvinyl pyrrolidone, a homopolymer and a copolymer of acrylamide, a homopolymer and a copolymer of methacrylamide, and a homopolymer and a copolymer of N-methylol acrylamide.

The weight-average molecular weight of the hydrophilic resin is preferably 2,000 or greater from the viewpoints of obtaining sufficient coated-film strength or printing durability.

The content of the hydrophilic resin is preferably in a range of 0.5% by mass to 50% by mass and more preferably in a range of 1% by mass to 30% by mass with respect to the total mass of the image recording layer.

The image recording layer may contain inorganic particles other than those for forming unevenness described above. Preferred examples of the inorganic particles include silica, alumina, magnesium oxide, titanium oxide, magnesium carbonate, calcium alginate, and a mixture of these. The inorganic particles can be used for the purpose of improving coated-film strength.

The average particle diameter of the inorganic particles is preferably in a range of 5 nm to 10 µm and more preferably in a range of 10 nm to 1 µm. When the average particle diameter thereof is in the above-described range, the thermoplastic polymer particles are stably dispersed, the film hardness of the image recording layer is sufficiently held, and a non-image portion with excellent hydrophilicity in which printing stain is unlikely to occur can be formed.

The inorganic particles are available as commercial products such as a colloidal silica dispersion.

The content of the inorganic particles is preferably in a range of 1.0% by mass to 70% by mass and more preferably in a range of 5.0% by mass to 50% by mass with respect to the total mass of the image recording layer.

The image recording layer may contain a plasticizer in order to impart flexibility to a coated film. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The content of the plasticizer is preferably in a range of 0.1% by mass to 50% by mass and more preferably in a range of 1% by mass to 30% by mass with respect to the total mass of the image recording layer.

In a case where polymer particles having a thermally reactive functional group (cross-linking group) are used for the image recording layer, a compound that initiates or promotes a reaction of the thermally reactive functional group (cross-linking group) can be added to the image recording layer as necessary. As the compound that initiates or promotes a reaction of the thermally reactive functional group, a compound that generates a radical or a cation by heating may be exemplified. Examples of the compound include a lophine dimer, a trihalomethyl compound, a peroxide, an azo compound, onium salts including diazonium salts and diphenyl iodonium salts, acyl phosphine, and imide sulfonate. The addition amount of such a compound is preferably in a range of 1% by mass to 20% by mass and more preferably in a range of 1% by mass to 10% by mass with respect to the total mass of the image recording layer. When the amount thereof is in the above-described range, on-press developability is not degraded and excellent effects for initiating or promoting a reaction are obtained.

<<Formation of Image Recording Layer C>>

The image recording layer C is formed by dissolving or dispersing each of the above-described required components in a suitable solvent to prepare a coating solution, coating a support with the coating solution directly or through an undercoat layer. As the solvent, water or a mixed solvent of water and an organic solvent is used, and a mixed solvent of water and an organic solvent is preferable from the viewpoint of the excellent surface state after coating. Since the amount of the organic solvent varies depending on the type of organic solvent, the amount thereof cannot be specified unconditionally, but the amount of the organic solvent in the mixed solvent is preferably in a range of 5% by volume to 50% by volume. Here, it is necessary that the amount of the organic solvent to be used is set to such that the thermoplastic polymer particles are not aggregated. The concentration of solid contents of the image recording layer coating solution is preferably in a range of 1% by mass to 50% by mass.

As the organic solvent used as a solvent of the coating solution, a water-soluble organic solvent is preferable. Specific examples thereof include alcohol solvents such as methanol, ethanol, propanol, isopropanol, or 1-methoxy-2-propanol, ketone solvents such as acetone or methyl ethyl ketone, glycol ether solvents such as ethylene glycol dimethyl ether, γ-butyrolactone, N,N-dimethylformamide, N,N-dimethylacetamide, tetrahydrofuran, and dimethylsulfoxide. Particularly, an organic solvent having a boiling point of 120° C. or lower and a solubility (amount of a solvent to be dissolved in 100 g of water) of 10 g or greater in water is preferable and an organic solvent having a solubility of 20 g or greater is more preferable.

As a coating method of the image recording layer coating solution, various methods can be used. Examples of the methods include a bar coater coating method, a rotary coating method, a spray coating method, a curtain coating method, a dip coating method, an air knife coating method, a blade coating method, and a roll coating method. The coating amount (solid content) of the image recording layer on the support obtained after the coating and the drying varies depending on the applications thereof, but is preferably in a range of 0.5 g/m$^2$ to 5.0 g/m$^2$ and more preferably in a range of 0.5 g/m$^2$ to 2.0 g/m$^2$.

Hereinafter, other constituent elements of the lithographic printing plate precursor will be described.

<Undercoat Layer>

The lithographic printing plate precursor according to the embodiment of the present disclosure may be provided with an undercoat layer between the image recording layer and the support as necessary. Since intimate attachment of the support to the image recording layer becomes stronger in an exposed portion and the support is easily peeled off from the image recording layer in an unexposed portion, the undercoat layer contributes to improvement of on-press developability without degrading printing durability. Further, in a case of infrared (IR) laser exposure, the undercoat layer functions as a heat insulating layer so that a degradation in sensitivity due to heat, generated by the exposure, being diffused in the support is prevented.

Examples of the compound used for the undercoat layer include a silane coupling agent having an ethylenic double bond reactive group, which is an addition-polymerizable group, described in JP1998-282679A (JP-H10-282679A); and a phosphorus compound having an ethylenic double bond reactive group described in JP1990-304441A (JP-H02-304441A). Preferred examples thereof include polymer compounds having an adsorptive group, which can be adsorbed to the surface of the support, a hydrophilic group, and a cross-linking group, as described in JP2005-125749A and JP2006-188038A. As such a polymer compound, a copolymer of a monomer having an adsorptive group, a monomer having a hydrophilic group, and a monomer having a cross-linking group is preferable. Specific examples thereof include a copolymer of a monomer having an adsorptive group such as a phenolic hydroxy group, a carboxy group, —PO$_3$H$_2$, —OPO$_3$H$_2$, —CONHSO$_2$—, —SO$_2$NHSO$_2$—, or —COCH$_2$COCH$_3$, a monomer having a hydrophilic group such as a sulfo group, and a monomer having a polymerizable cross-linking group such as a methacryl group or an allyl group. The polymer compound may have a cross-linking group introduced by forming salts between a polar substituent of the polymer compound and a compound that includes a substituent having the opposite charge of the polar substituent and an ethylenically unsaturated bond. Further, monomers other than the above-described monomers, preferably hydrophilic monomers may be further copolymerized.

The content of the ethylenically unsaturated bond in the polymer compound for an undercoat layer is preferably in a range of 0.1 to 10.0 mmol and more preferably in a range of 2.0 to 5.5 mmol with respect to 1 g of the polymer compound.

The weight-average molecular weight of the polymer compound for an undercoat layer is preferably 5,000 or greater and more preferably in a range of 10,000 to 300,000.

For the purpose of preventing stain over time, the undercoat layer may contain a chelating agent, a secondary or tertiary amine, a polymerization inhibitor, a compound that includes an amino group or a functional group having polymerization inhibiting ability and a group interacting with the surface of an aluminum support, and the like (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyl imino diacetic acid) in addition to the compounds for an undercoat layer described above.

The undercoat layer is applied according to a known method. The coating amount of the undercoat layer in terms of a coating amount after drying is preferably in a range of 0.1 mg/m$^2$ to 100 mg/m$^2$ and more preferably in a range of 1 mg/m$^2$ to 30 mg/m$^2$.

<Protective Layer>

In the lithographic printing plate precursor according to the embodiment of the present disclosure, a protective layer may be provided on the image recording layer as necessary. The protective layer has a function of preventing generation of scratches to the image recording layer and a function of preventing ablation at the time of high illuminance laser exposure, in addition to a function of suppressing a reaction of inhibiting image formation through oxygen blocking.

As the protective layer having such functions, a protective layer described in paragraphs 0202 to 0204 of JP2014-104631A can be used.

The protective layer is applied according to a known method. The coating amount of the protective layer after the drying is preferably in a range of 0.01 g/m$^2$ to 10 g/m$^2$, more preferably in a range of 0.02 g/m$^2$ to 3 g/m$^2$, and particularly preferably in a range of 0.02 g/m$^2$ to 1 g/m$^2$.

The lithographic printing plate precursor can be produced by applying a coating solution of each configuration layer according to a typical method, performing drying, and forming each configuration layer. The coating solution can be applied according to a die coating method, a dip coating method, an air knife coating method, a curtain coating method, a roller coating method, a wire bar coating method, a gravure coating method, or a slide coating method.

(Lithographic Printing Plate and Production Method Thereof and Lithographic Printing Method)

The lithographic printing plate according to the present disclosure is a lithographic printing plate obtained by plate-making the lithographic printing plate precursor according to the embodiment of the present disclosure.

The method of producing a lithographic printing plate according to the embodiment of the present disclosure is not particularly limited as long as the method is a method of producing a lithographic printing plate using the lithographic printing plate precursor according to the embodiment of the present disclosure, and it is preferable that the method is a production method of plate-making a lithographic printing plate using the lithographic printing plate precursor according to the embodiment of the present disclosure and includes a step of image-wise exposing the lithographic printing plate precursor according to the embodiment of the present disclosure to form an exposed portion and an unexposed portion (also referred to as an "image exposure step"); and a step of supplying at least one of printing ink or dampening water to remove a non-image portion (also referred to as a "development treatment step").

The lithographic printing method according to the embodiment of the present disclosure is a method of producing a lithographic printing plate using the lithographic printing plate precursor according to the embodiment of the present disclosure and performing printing and is also a production method of plate-making a lithographic printing plate using the lithographic printing plate precursor according to the embodiment of the present disclosure, and it is preferable that the method includes a step of image-wise exposing the lithographic printing plate precursor according to the embodiment of the present disclosure to form an exposed portion and an unexposed portion (also referred to as an "image exposure step"); a step of supplying at least one of printing ink or dampening water to remove a non-image portion (also referred to as a "development treatment step"); and a step of performing printing using the obtained lithographic printing plate (also referred to as a "printing step").

In the lithographic printing plate precursor according to the embodiment of the present disclosure, the development treatment step is performed without performing the image exposure step in a case of the key plate precursor.

<Image Exposure Step>

The image exposure of the lithographic printing plate precursor can be performed in conformity with an image exposure operation for a typical lithographic printing plate precursor.

The image exposure is performed by laser exposure through a transparent original picture having a line image, a halftone image, and the like or by laser beam scanning using digital data. The wavelength of a light source is preferably in a range of 700 nm to 1,400 nm. As the light source having a wavelength of 700 nm to 1,400 nm, a solid-state laser or a semiconductor laser that radiates infrared rays is preferable. The output of the infrared laser is preferably 100 mW or greater, the exposure time per one pixel is preferably within 20 μsec, and the irradiation energy quantity is preferably in a range of 10 mJ/cm$^2$ to 300 mJ/cm$^2$. For the purpose of reducing the exposure time, it is preferable to use a multi-beam laser device. The exposure mechanism may be any of an internal drum system, an external drum system, a flat bed system, and the like. The image exposure can be performed using a plate setter according to a usual method.

<Development Treatment Step>

The development treatment can be performed using a typical method. In a case of on-press development, a printing ink receiving unit having a lipophilic surface is formed by the image recording layer in the image portion of the image recording layer in a case where at least one of dampening water and printing ink is supplied to the image-exposed lithographic printing plate precursor on a printing press. Meanwhile, in a non-image portion, a non-cured image recording layer is dissolved or dispersed by at least any of supplied dampening water and printing ink and then removed, a hydrophilic surface is exposed to the portion. As the result, dampening water adheres to the exposed hydrophilic surface, the printing ink is impressed on the image recording layer of the image portion, and then the printing is started. Here, either of dampening water or printing ink may be initially supplied to the surface of the lithographic printing plate precursor, but it is preferable that dampening water is initially supplied thereto so that the on-press developability is promoted by permeation of the dampening water.

<Printing Step>

The printing using the obtained lithographic printing plate can be performed according to a typical method. The printing can be performed by supplying desired printing ink and dampening water, as necessary, to the lithographic printing plate.

The amount of the printing ink and dampening water to be supplied is not particularly limited and may be appropriately set according to the desired printing.

The method of supplying the printing ink and dampening water to the lithographic printing plate is not particularly limited and a known method can be used.

The lithographic printing method according to the present disclosure may include known steps other than the above-described steps. Examples of other steps include a plate inspection step of confirming the position or orientation of the lithographic printing plate precursor before each step and a confirmation step of confirming the printed image after the development treatment step.

EXAMPLES

Hereinafter, the present disclosure will be described in detail with reference to examples, but the present disclosure is not limited thereto. In the present examples, "%" and "parts" respectively indicate "% by mass" and "parts by mass" unless otherwise specified. Further, in a polymer compound, the molecular weight indicates the weight-average molecular weight (Mw) and the proportion of constitutional units indicates mole percentage unless otherwise specified. Further, the weight-average molecular weight (Mw) is a value in terms of polystyrene obtained by performing measurement using gel permeation chromatography (GPC).

Further, the melting point, the average dimension, and the average height of the projections and the occupation area ratio of the projections on the surface of the outermost layer in each example and each comparative example were measured according to the above-described methods.

<Method of Producing Support 1>

As roughening treatments, the following (a) to (e) treatments were performed. Further, a water washing treatment was performed between all treatment steps.

(a) Alkali Etching Treatment

An aluminum plate (material JIS 1052) having a thickness of 0.3 mm was subjected to an etching treatment by spraying an aqueous solution at a temperature of 60° C. in which the concentration of caustic soda was 25% by mass and the concentration of aluminum ions was 100 g/L using a spray tube. The etching amount of the surface of the aluminum plate to be subjected to an electrochemical roughening treatment was 3 g/m$^2$.

(b) Desmutting Treatment

Next, a desmutting treatment was performed by spraying a sulfuric acid aqueous solution (concentration of 300 g/L) at a temperature of 35° C. for 5 seconds using the spray tube.

(c) Electrolytic Roughening Treatment

Thereafter, an electrochemical roughening treatment was continuously performed using an electrolyte (liquid temperature of 35° C.) obtained by dissolving aluminum chloride in a 1 mass % hydrochloric acid aqueous solution and adjusting the aluminum ion concentration to 4.5 g/L, a 60 Hz AC power source, and a flat cell type electrolytic cell. A sine wave was used as the waveform of the AC power source. In the electrochemical roughening treatment, the current density of the aluminum plate during the anodic reaction at the peak of the alternating current was 30 A/dm$^2$. The ratio between the total electric quantity during the anodic reaction and the total electric quantity during the cathodic reaction of the aluminum plate was 0.95. The electric quantity was set to 480 C/dm$^2$ in terms of the total electric quantity during the anodic reaction of the aluminum plate. The electrolyte was circulated using a pump so that the stirring inside the electrolytic cell was performed.

(d) Alkali Etching Treatment

The aluminum plate was subjected to an etching treatment by spraying an aqueous solution at a temperature of 35° C. in which the concentration of caustic soda was 5% by mass and the concentration of aluminum ions was 5 g/L using a spray tube. The etching amount of the surface of the aluminum plate on which the electrolytic roughening treatment had been performed was 0.05 g/m².

(e) Desmutting Treatment

Next, a desmutting treatment was performed by spraying an aqueous solution at a liquid temperature of 35° C. with a sulfuric acid concentration of 300 g/L and an aluminum ion concentration of 5 g/L using the spray tube for 5 seconds.

The aluminum plate on which the roughening treatment had been performed was subjected to an anodizing treatment at a treatment temperature of 38° C. and a current density of 15 A/dm² using a 22 mass % phosphoric acid aqueous solution as an electrolyte.

Thereafter, washing with water by spraying was performed. The final amount of the oxide film was 1.5 g/m². The surface of the substrate was imaged at a magnification of 150,000 times using an electronic microscope and the average pore diameter in a case of n=90 was actually measured, and the value was 30 nm.

<Production of Support 2>

An aluminum alloy plate having a thickness of 0.3 mm and having a composition listed in Table 1 was subjected to the following treatments (a) to (m), whereby a support 2 was produced. Moreover, during all treatment steps, a water washing treatment was performed, and liquid cutting was performed using a nip roller after the water washing treatment.

Further, the support 2 is a support used after 10 days from the anodizing treatment performed on the obtained support.

TABLE 1

| Composition (% by mass) | | | | | | | |
|---|---|---|---|---|---|---|---|
| Si | Fe | Cu | Mn | Mg | Zn | Ti | Al |
| 0.085 | 0.303 | 0.037 | 0 | 0 | 0 | 0.018 | Residue |

(a) Mechanical Roughening Treatment (Brush Grain Method)

While supplying a suspension of pumice (specific gravity of 1.1 g/cm³) to the surface of an aluminum plate as a polishing slurry liquid, a mechanical roughening treatment was performed using rotating bundle bristle brushes.

The mechanical roughening treatment was performed under conditions in which the median diameter of a polishing material pumice was 30 μm, the number of the bundle bristle brushes was four, and the rotation speed of the bundle bristle brushes was set to 250 rpm. The material of the bundle bristle brushes was nylon 6·10, the diameter of the brush bristles was 0.3 mm, and the bristle length was 50 mm. The bundle bristle brushes were produced by implanting bristles densely into holes in a stainless steel cylinder having a diameter of φ300 mm. The distance between two support rollers (φ200 mm) of the lower portion of the bundle bristle brushes was 300 mm. The bundle bristle brushes were pressed until the load of a driving motor for rotating the brushes became 10 kW plus with respect to the load before the bundle bristle brushes were pressed against the aluminum plate. The rotation direction of the bundle bristle brushes was the same as the moving direction of the aluminum plate.

(b) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m².

(c) Desmutting Treatment in Acidic Aqueous Solution

Next, a desmutting treatment was performed in a nitric acid aqueous solution. As the nitric acid aqueous solution used in the desmutting treatment, a nitric acid electrolyte used in electrochemical roughening of the subsequent step was used. The solution temperature was 35° C. The desmutting treatment was performed for 3 seconds by spraying the desmutting liquid using a spray.

(d) Electrochemical Roughening Treatment

An electrochemical roughening treatment was continuously performed using an AC voltage of 60 Hz. An electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. The current density was 30 A/dm² as the peak current value, and 5% of the current from the power source was separately flowed to the auxiliary anode. The electric quantity was 185 C/dm² as the sum total of electric quantity at the time of anodization of the aluminum plate. Thereafter, washing with water by spraying was performed.

(e) Alkali Etching Treatment

The aluminum plate was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m².

(f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The solution temperature was 60° C. The desmutting treatment was performed for 3 seconds by spraying the desmutting liquid using a spray.

(g) Electrochemical Roughening Treatment

An electrochemical roughening treatment was continuously performed using an AC voltage of 60 Hz. An electrolyte which had been adjusted to have a concentration of aluminum ions of 4.5 g/L by adding aluminum chloride to a hydrochloric acid aqueous solution having a concentration of 6.2 g/L at a liquid temperature of 35° C. was used. Using a trapezoidal rectangular waveform AC having a time tp, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. The current density was 25 A/dm² as the peak current value, and the electric quantity in the hydrochloric acid electrolysis was 63 C/dm² as the sum total of electric quantity at the time of anodization of the aluminum plate. Thereafter, washing with water by spraying was performed.

(h) Alkali Etching Treatment

The aluminum plate was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m².

(i) Desmutting Treatment in Acidic Aqueous Solution

Next, a desmutting treatment was performed in a sulfuric acid aqueous solution. The desmutting treatment was performed at a solution temperature of 35° C. for 4 seconds using the sulfuric acid aqueous solution (aluminum ions having a concentration of 5 g/L were contained in a sulfuric acid aqueous solution having a concentration of 170 g/L) used for the anodizing treatment step. The desmutting treatment was performed for 3 seconds by spraying the desmutting liquid using a spray.

(j) First Anodizing Treatment

A first step of an anodizing treatment was performed with an anodizing device using DC electrolysis. An anodized film having a predetermined film thickness was formed by performing an anodizing treatment under conditions listed in Table 2. An aqueous solution containing components listed in Table 2 was used as the electrolyte. In Tables 2 to 4, the "component concentration" indicates the concentration (g/L) of each component described in the column of "liquid component".

TABLE 2

| First anodizing treatment | | | | | | |
|---|---|---|---|---|---|---|
| Liquid type | Liquid component | Component concentration (g/L) | Temperature (° C.) | Current density (A/dm²) | Time (s) | Film thickness (nm) |
| Sulfuric acid | $H_2SO_4$/Al | 170/5 | 55 | 90 | 0.40 | 110 |

(k) Second Anodizing Treatment

A second step of an anodizing treatment was performed with an anodizing device using DC electrolysis. An anodized film having a predetermined film thickness was formed by performing an anodizing treatment under conditions listed in Table 3. An aqueous solution containing components listed in Table 3 was used as the electrolyte.

TABLE 3

| Second anodizing treatment | | | | | | |
|---|---|---|---|---|---|---|
| Liquid type | Liquid component | Component concentration (g/L) | Temperature (° C.) | Current density (A/dm²) | Time (s) | Film thickness (nm) |
| Sulfuric acid | $H_2SO_4$/Al | 170/5 | 54 | 15 | 13 | 900 |

(l) Third Anodizing Treatment

A third step of an anodizing treatment was performed with an anodizing device using DC electrolysis. An anodized film having a predetermined film thickness was formed by performing an anodizing treatment under conditions listed in Table 4. An aqueous solution containing components listed in Table 4 was used as the electrolyte.

TABLE 4

| Third anodizing treatment | | | | | | |
|---|---|---|---|---|---|---|
| Liquid type | Liquid component | Component concentration (g/L) | Temperature (° C.) | Current density (A/dm²) | Time (s) | Film thickness (nm) |
| Sulfuric acid | $H_2SO_4$/Al | 170/5 | 54 | 50 | 0.4 | 100 |

(m) Hydrophilization Treatment

In order to ensure hydrophilicity of a non-image portion, the non-image portion was subjected to a silicate treatment by being dipped in 2.5% by mass of a No. 3 sodium silicate aqueous solution at 50° C. for 7 seconds. The adhesion amount of Si was 8.5 mg/m². Thereafter, washing with water by spraying was performed.

The average diameter (average diameter of surface layer) of a large-diameter hole portion on the surface of the anodized film having micropores obtained in the above-described manner, the average diameter (average diameter of bottom portion) of the large-diameter hole portion in a communication position, the average diameter (diameter of small-diameter hole portion) of a small-diameter hole portion in the communication position, the average depth of the large-diameter hole portion and the small-diameter hole portion, the thickness (thickness of barrier layer) of the anodized film from the bottom portion of the small-diameter hole portion to the surface of the aluminum plate, the density of the small-diameter hole portion, and the like are listed in Tables 5 and 6. The small-diameter hole portion includes a first small-diameter hold portion and a second small-diameter hole portion with depths different from each other and a small-diameter hole portion which is deeper than the other is referred to as the first small-diameter hole portion.

TABLE 5

| Micropores Large-diameter hole portion | | | | | |
|---|---|---|---|---|---|
| Average diameter of surface layer (nm) | Average diameter of bottom portion (nm) | Average depth (nm) | Average depth/ Average diameter of surface layer | Average depth/ Average diameter of bottom portion | Shape |
| 12 | 25 | 98 | 8.2 | 3.9 | Reversely tapered shape |

TABLE 6

| Micropores | | | | | | | Ratio (Average diameter of surface layer/Diameter of small-diameter hole portion) |
|---|---|---|---|---|---|---|---|
| Small-diameter hole portion | | | | | | | |
| Average diameter (nm) | Average depth (nm) | Density of communication portion (pieces/μm²) | Average thickness of barrier layer (nm) | Minimum thickness of barrier layer (nm) | Density of micropores (pieces/ pieces/μm²) | Increase magnification of surface area | |
| 9.8 | 888, 968 | 800 (650) | 17 | 16 | 500 | 4.0 | 1.22 |

In Table 6, the average value and the minimum value of the barrier layer thickness are shown. The average value is obtained by measuring 50 thicknesses of the anodized film from the bottom portion of the first small-diameter hole portion to the surface of the aluminum plate and arithmetically averaging the values.

The average diameter of micropores (average diameter of large-diameter hole portion and small-diameter hole portion) is a value obtained by observing four sheets (N=4) of the surfaces of the large-diameter hole portion and the surfaces of the small-diameter hole portion using a field emission scanning electron microscope (FE-SEM) at a magnification of 150,000 times, measuring the diameters of micropores (the large-diameter hole portion and the small-diameter hole portion) present in a range of 400×600 nm² in the obtained images of four sheets, and averaging the values. Further, in a case where the depth of the large-diameter hole portion is deep and the diameter of the small-diameter hole portion is unlikely to be measured, the upper portion of the anodized film is cut and then various kinds of diameters are acquired.

The average depth of the large-diameter hole portion is a value obtained by measuring the cross section of the support (anodized film) using FE-TEM at a magnification of 500,000 times, measuring 60 cases (N=60) of distances from the surface of an arbitrary micropore to the communication position in the obtained image, and averaging the values. Further, the average depth of the small-diameter hole portion is a value obtained by observing the cross section of the support (anodized film) using FE-SEM (at a magnification of 50,000 times), measuring 25 depths of arbitrary micropores in the obtained image, and averaging the values.

The "density of the communication portion" indicates the density of the small-diameter hole portion of the cross section of the anodized film in the communication position. The "increase magnification of the surface area" indicates the value calculated based on the following Equation (A).

Increase magnification of surface area=1+pore density'(($\pi\times$(average diameter of surface layer/2+ average diameter of bottom portion/2)$\times$((average diameter of bottom portion/2−average diameter of surface layer/2)²+depth $A^2$)$^{1/2}$+$\pi\times$ (average diameter of bottom portion/2)²−$\pi\times$ (average diameter of surface layer/2)²))    Equation (A)

In the column of the "average depth (nm)" of the small-diameter hole portion, the average depth of the second small-diameter hole portion is shown on the left side and the average depth of the first small-diameter hole portion is shown on the right side. In the column of the "density of communication portion" of the small-diameter hole portion in Table 6, the density of the first small-diameter hole portion is shown in parentheses together with the density of the communication portion of the small-diameter hole portion.

In addition, the average diameter of the first small-diameter hole portion positioning from the bottom portion of the second small-diameter hole portion to the bottom portion of the first small-diameter hole portion was approximately 12 nm.

<Production of Support 3>

An aluminum plate having a thickness of 0.19 mm was immersed in a 40 g/L sodium hydroxide aqueous solution at 60° C. for 8 seconds so as to be degreased and then washed with demineralized water for 2 seconds. Next, the aluminum plate was subjected to an electrochemical roughening treatment in an aqueous solution containing 12 g/L of hydrochloric acid and 38 g/L of aluminum sulfate (18 hydrates) at a temperature of 33° C. and at a current density of 130 A/dm² using an AC for 15 seconds. Next, the aluminum plate was washed with demineralized water for 2 seconds, subjected to a desmutting treatment by being etched using 155 g/L of a sulfuric acid aqueous solution at 70° C. for 4 seconds, and washed with demineralized water at 25° C. for 2 seconds. The aluminum plate was subjected to an anodizing treatment in 155 g/L of a sulfuric acid aqueous solution for 13 seconds at a temperature of 45° C. and at a current density of 22 A/dm² and washed with demineralized water for 2 seconds. Further, the aluminum plate was treated at 40° C. for 10 seconds using 4 g/L of a polyvinyl phosphonic acid aqueous solution, washed with demineralized water at 20° C. for 2 seconds, and then dried, thereby producing a support. The surface roughness Ra of the obtained support was 0.21 μm and the amount of the anodized film was 4 g/m².

<Formation of Undercoat Layer>

One surface of the support was coated with an undercoat layer coating solution (1) having the following composition such that the drying coating amount was set to 20 mg/m², thereby forming an undercoat layer.

(Undercoat layer coating solution (1))

Compound (A-1) for undercoat layer (the following structure): 0.18 parts

Hydroxyethyl imino diacetic acid: 0.05 parts

Surfactant (EMALEX 710, manufactured by Nihon Emulsion Co., Ltd.): 0.03 parts

Water: 28.0 parts

A-1

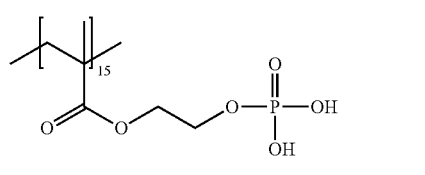

Mw: 100,000

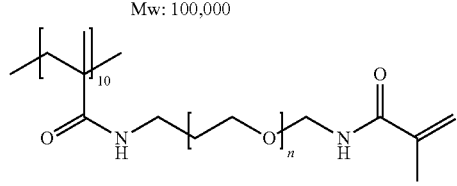

n(repeating unit) = 3

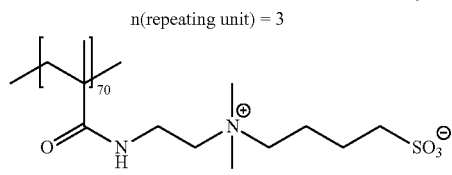

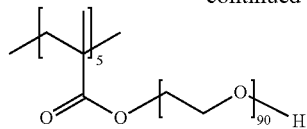

<Formation of Image Recording Layer 1>

The support on which the undercoat layer was not formed was bar-coated with an image recording layer coating solution (1) having the following composition and dried in an oven at 70° C. for 60 seconds, thereby forming an image recording layer having a drying coating amount of 0.6 g/m².

<Image forming layer coating solution (1)>

Polymerizable compound 1*¹: 0.325 parts
 *1: Dipentaerythritol hexaacrylate (manufactured by Shin Nakamura Chemical Industry Co., Ltd.)

Graft copolymer 1*²: 0.060 parts
 *2: The graft copolymer 1 is a polymer grafted by poly(oxy-1,2-ethanediyl), α-(2-methyl-1-oxo-2-propenyl)-co-methoxy-, and ethenylbenzene, and a dispersion containing 25% by mass of this polymer in a solvent containing n-propanol and water at a mass ratio of 80:20 is used.

Graft copolymer 2*³: 0.198 parts
 *3: The graft copolymer 2 is a polymer particle of a graft copolymer of poly(ethylene glycol)methyl ether methacrylate, styrene, and acrylonitrile at a mixing ratio of 10:9:81, and a dispersion containing 24% by mass of the polymer particles in a solvent containing n-propanol and water at a mass ratio of 80:20 is used. Further, the volume average particle diameter is 193 run.

Mercapto-3-triazole*⁴: 0.180 parts
 *4: Mercapto-3-triazole indicates mercapto-3-triazole-1H,2,4 which is commercially available from PCAS (France).

Irgacure 250*⁵: 0.032 parts
 *5: Irgacure 250 has, as a 75% propylene carbonate solution of iodonium (4-methylphenyl)[4-(2-methylpropyl)phenyl]hexafluorophosphate that can be procured from Ciba Specialty Chemicals Inc.

Infrared absorbent 1 (the following structure): 0.007 parts

Sodium tetraphenylborate (the following structure): 0.04 parts

Klucel 99M*⁶: 0.007 parts
 *6: Klucel 99M is a hydroxypropyl cellulose thickener used as a 1% aqueous solution which is commercially available from Hercules (Belgium, Heverlee).

Byk 336*⁷: 0.015 parts
 *7: Byk 336 is a modified dimethyl polysiloxane copolymer which is commercially available from BYK-Chemie Japan K. K., in a 25% xylene/methoxypropylacetate solution.

n-propanol: 7.470 parts

Water: 1.868 parts

<Formation of Image Recording Layer 2>

The undercoat layer in the support on which the undercoat layer has been formed was bar-coated with an image recording layer coating solution (1) with the following composition and dried in an oven at 100° C. for 60 seconds, thereby forming an image recording layer having a drying coating amount of 1.0 g/m².

The image recording layer coating solution (1) was obtained by mixing a photosensitive solution (1) and a microgel solution (1) described below immediately before the coating and then stirring the solution.

<Image Forming Layer Coating Solution (2)>

Binder polymer (1) [the following structure]: 0.240 parts

Infrared absorbent (2) [the following structure]: 0.030 parts

Polymerization initiator (1) [the following structure]: 0.162 parts

Polymerizable compound (Tris(acryloyloxyethyl) isocyanurate, NK ESTER A-9300, manufactured by Shin-Nakamura Chemical Co., Ltd.): 0.192 parts Tris(2-hydroxyethyl) isocyanurate: 0.062 parts Benzyldimethyloctyl ammonium.$PF_6$ salt: 0.018 parts Ammonium group-containing polymer [the following structure]: 0.010 parts Fluorine-based surfactant (1) [the following structure]: 0.008 parts Methyl ethyl ketone: 1.091 parts 1-methoxy-2-propanol: 8.609 parts Polymer particles (hydrophobized precursor) aqueous dispersion liquid: 5.065 parts

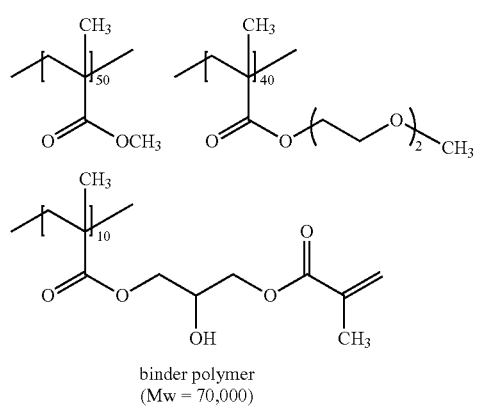

binder polymer
(Mw = 70,000)

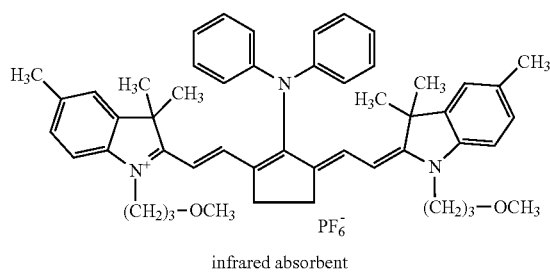

infrared absorbent

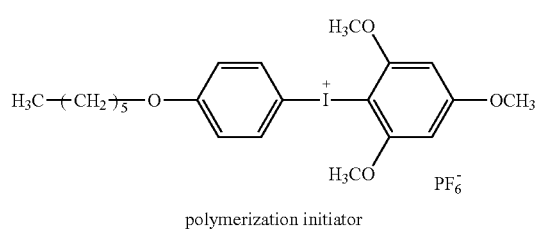

polymerization initiator

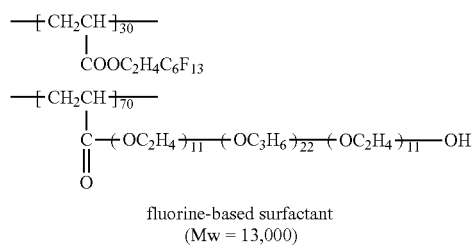

fluorine-based surfactant
(Mw = 13,000)

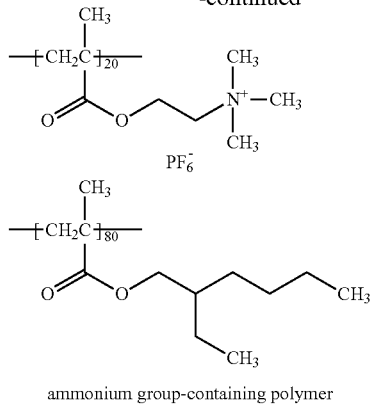

ammonium group-containing polymer

<Formation of Image Recording Layer 3>

A water-based coating solution for an image recording layer containing components such as the thermoplastic resin particles and the infrared absorbent shown below was prepared, and the pH thereof was adjusted to 3.6, the support was coated with the coating solution, and dried at 50° C. for 1 minute, thereby forming an image recording layer 3.

A thermoplastic particle polymer SAN, an infrared absorbent IR-01, other components PAA, and the surfactant used in the coating solution for an image recording layer are as follows.

Thermoplastic resin particle SAN: styrene/acrylonitrile copolymer (molar ratio of 50/50), average particle diameter of 61 nm, coating amount of 0.6927 ($g/m^2$)

Other components PAA: polyacrylic acid, weight-average molecular weight of 250,000, coating amount of 0.09 ($g/m^2$)

Surfactant: Zonyl FSO100 (manufactured by Du Pont), coating amount of 0.0075 ($g/m^2$)

Infrared absorbent IR-01: infrared absorbent with the following structure (Et represents an ethyl group), coating amount of $1.03 \times 10^{-4}$ ($mol/m^2$)

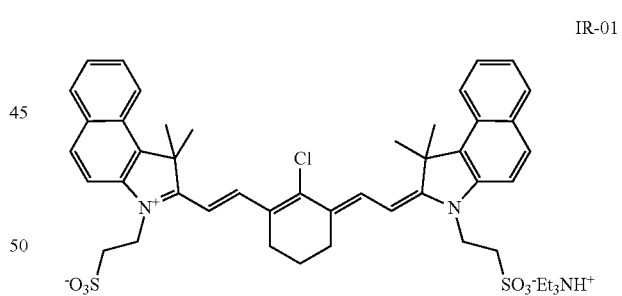

IR-01

<Formation of Projections (1)>

An image recording layer was bar-coated with the coating solution (1) for projections with the following composition and dried in an oven at 120° for 60 seconds, thereby forming discontinuous projections having a drying coating amount of 0.025 $g/m^2$.

—Coating Solution (1) for Projections—

AQUAMAT 263 (oxidized crosslinked high-density polyethylene (melting point of 130° C.) dispersion liquid, manufactured by BYK-Chemie Japan K. K.): 0.08 parts Ion exchange water: 7.42 parts —Coating Solutions (2) to (49) for Projections—

Each of the coating solutions (2) to (49) for projections was prepared using the same method as that for the coating solution (1) for projections except that the materials listed in Table 7 were used in place of AQUAMAT 263 (manufactured by BYK-Chemie Japan K. K.) of the coating solution (1) for projections and the coating amounts were changed as listed in Table 7.

Examples 1 to 39 and Comparative Examples 1 to 8

<Production of Lithographic Printing Plate Precursor>

Each lithographic printing plate precursor was obtained by forming the undercoat layer on the support listed in Table 7 in a case where the image recording layer 2 was provided, forming the image recording layer listed in Table 7, and forming the projections listed in Table 7.

In Comparative Example 2, a uniform coating film (continuous film) was formed on the outermost layer using SD1000 and a LUBA-print VP499/A wax dispersion liquid.

<Scratch Resistance of Outer Layer>

The scratch test was performed by applying a load of up to 100 g on a sapphire needle having a diameter of 0.1 mm starting from a load of 5 g by increasing 5 g each time using a scratch strength tester (manufactured by Shinto Scientific Co., Ltd.) and scanning the surface of each sample of the lithographic printing plate precursor, the load at the time of scratching was measured, and the presence of damage to the image portion due to the scratches and occurrence of ink stains and development failure in the non-image portion were visually observed. Each precursor was placed on a Kodak (registered trademark) Trendsetter 80011 Quantum plate setter (exposure wavelength of 830 nm) and exposed using an IR laser having a wavelength of 830 nm such that the scratched portion extended over the solid image, the exposed image having a 50% halftone dot chart of an FM screen having dots with a diameter of 20 µm, and the non-image portion. The obtained exposed precursor was attached to a printing press LITHRONE26 (manufactured by KOMORI Corporation) without performing a development treatment. After the on-press development was performed by supplying dampening water and ink according to a standard automatic printing start method for LITHRONE26 using dampening water in which the volume ratio of Ecolity-2 (manufactured by Fujifilm Corporation) to tap water was 2:98 and Space color fusion G black ink (manufactured by DIC Graphics Corporation), printing was performed on 500 sheets of Tokubishi Art (manufactured by Mitsubishi Paper Mills, Ltd., ream weight: 76.5 kg) paper at a printing speed of 10,000 sheets per hour.

The maximum load at which the image portion was not damaged due to scratches and ink stains or development failure did not occur in the non-image portion on the obtained 500-th printed material was evaluated as the scratch resistance (g) of the outer layer.

<Impressing Property>

Each of the obtained exposed precursors used in the evaluation of the scratch resistance of the outer layer was attached to a printing press LITHRONE26 (manufactured by KOMORI Corporation). After the on-press development was performed by supplying dampening water and ink according to a standard automatic printing start method for LITHRONE26 using dampening water in which the volume ratio of Ecolity-2 (manufactured by Fujifilm Corporation) to tap water was 2:98 and Vaues-G black ink (manufactured by DIC Graphics Corporation), printing was started and performed on 100 sheets of Tokubishi Art (manufactured by Mitsubishi Paper Mills, Ltd., ream weight: 76.5 kg) paper at a printing speed of 10,000 sheets per hour.

The printing initial ink impressing property was measured based on the number of sheets of printing paper required for the ink density of the image recording layer on the printing paper in the exposed portion area to reach the prescribed standard density.

<On-Press Developability>

Each of the obtained lithographic printing plate precursors was exposed using Luxel PLATESETTER T-6000III (manufactured by Fujifilm Corporation) equipped with an infrared semiconductor laser under conditions of an external surface drum rotation speed of 1,000 rpm (revolutions per min), a laser output of 70%, and a resolution of 2,400 dpi (dot per inch). The exposed image had a solid image and a 50% halftone dot chart of an FM screen having dots with a diameter of 20 µm.

The obtained exposed precursor was attached to a printing press LITHRONE26 (manufactured by KOMORI Corporation) without performing a development treatment. After the on-press development was performed by supplying dampening water and ink according to a standard automatic printing start method for LITHRONE26 using dampening water in which the volume ratio of Ecolity-2 (manufactured by Fujifilm Corporation) to tap water was 2:98 and Space color fusion G black ink (manufactured by DIC Graphics Corporation), printing was performed on 500 sheets of Tokubishi Art (manufactured by Mitsubishi Paper Mills, Ltd., ream weight: 76.5 kg) paper at a printing speed of 10,000 sheets per hour.

The on-press developability was measured based on the number of sheets of printing paper required for the on-press development of the unexposed portion of the image recording layer on the printing press to be completed and for the ink not to be transferred to the non-image portion.

<Printing Durability>

In the evaluation of the on-press developability, after printing was performed on 500 sheets, the printing was further performed at a printing speed of 10,000 sheets per hour. With an increase in number of printed sheets, the ink density in the printing paper was decreased because the image recording layer was gradually worn out and thus the ink receptivity was degraded. In the printing plate exposed at the same exposure amount, the printing durability was evaluated based on the number of printed sheets at the time of a decrease in the ink density (reflection density) by 0.1 from the start of the printing. The evaluation of the printing durability was expressed as the relative printing durability defined as follows, with Comparative Example 1 as a reference (100). As the value of the relative printing durability increases, this indicates that the printing durability is high.

Relative printing durability=(printing durability of target lithographic printing plate precursor)/ (printing curability of reference lithographic printing plate precursor)

TABLE 7

| | Type of image recording layer | Projection | | | | | Evaluation result | | | |
|---|---|---|---|---|---|---|---|---|---|---|
| | | Material | Coating amount (mg/m²) | Melting point (° C.) | Average dimension (μm) | Average height (μm) | Occupation area ratio (%) | Printing durability | On-press develop-ability (sheets) | Impressing property (sheets) | Scratch resistance of outer layer |

| | Type of image recording layer | Material | Coating amount (mg/m²) | Melting point (° C.) | Average dimension (μm) | Average height (μm) | Occupation area ratio (%) | Printing durability | On-press develop-ability (sheets) | Impressing property (sheets) | Scratch resistance of outer layer |
|---|---|---|---|---|---|---|---|---|---|---|---|
| Example 1 | 1 | AQUAMAT263 | 25 | 130 | 0.70 | 1.05 | 1.5 | 100 | 10 | 8 | 40 |
| Example 2 | 1 | AQUAMAT263 | 50 | 130 | 0.75 | 1.13 | 3.6 | 100 | 10 | 8 | 60 |
| Example 3 | 1 | AQUAMAT263 | 100 | 130 | 0.80 | 1.20 | 6.3 | 100 | 10 | 8 | 80 |
| Example 4 | 1 | AQUAMAT263 | 200 | 130 | 0.83 | 1.25 | 12.3 | 100 | 10 | 8 | 100 |
| Example 5 | 1 | AQUAMAT263 | 5 | 130 | 0.50 | 0.75 | 0.3 | 100 | 10 | 8 | 35 |
| Example 6 | 1 | AQUAMAT263 | 350 | 130 | 0.80 | 1.20 | 21.0 | 100 | 30 | 8 | 100 |
| Example 7 | 1 | AQUAMAT272 | 25 | 125 | 0.75 | 1.13 | 1.5 | 100 | 10 | 8 | 40 |
| Example 8 | 1 | AQUAMAT272 | 100 | 125 | 0.75 | 1.13 | 6.3 | 100 | 10 | 8 | 80 |
| Example 9 | 1 | AQUAMAT272 | 200 | 125 | 0.75 | 1.13 | 12.3 | 100 | 10 | 8 | 100 |
| Example 10 | 1 | AQUACER531 | 25 | 130 | 0.75 | 1.13 | 1.5 | 100 | 10 | 8 | 40 |
| Example 11 | 1 | AQUACER531 | 100 | 130 | 0.75 | 1.13 | 6.3 | 100 | 10 | 8 | 80 |
| Example 12 | 1 | AQUACER531 | 200 | 130 | 0.75 | 1.13 | 12.3 | 100 | 10 | 8 | 100 |
| Example 13 | 1 | CERAFLOUR927 | 25 | 125 | 9.0 | 13.5 | 1.5 | 100 | 10 | 8 | 40 |
| Example 14 | 1 | CERAFLOUR927 | 100 | 125 | 9.0 | 13.5 | 6.3 | 100 | 10 | 8 | 80 |
| Example 15 | 1 | CERAFLOUR927 | 200 | 125 | 9.0 | 13.5 | 12.3 | 100 | 10 | 8 | 100 |
| Example 16 | 1 | AQUACER537 | 25 | 110 | 0.75 | 1.13 | 1.5 | 100 | 10 | 8 | 40 |
| Example 17 | 1 | AQUACER537 | 50 | 110 | 0.75 | 1.13 | 3.6 | 100 | 10 | 8 | 60 |
| Example 18 | 1 | AQUACER539 | 25 | 90 | 0.75 | 1.13 | 1.5 | 100 | 10 | 8 | 40 |
| Example 19 | 1 | AQUACER539 | 50 | 90 | 0.75 | 1.13 | 3.6 | 100 | 10 | 8 | 60 |
| Example 20 | 2 | AQUAMAT263 | 25 | 130 | 0.70 | 1.05 | 1.5 | 100 | 10 | 8 | 40 |
| Example 21 | 2 | AQUAMAT263 | 50 | 130 | 0.75 | 1.13 | 3.6 | 100 | 10 | 8 | 60 |
| Example 22 | 2 | AQUAMAT263 | 100 | 130 | 0.80 | 1.20 | 6.3 | 100 | 10 | 8 | 80 |
| Example 23 | 2 | AQUAMAT263 | 200 | 130 | 0.83 | 1.25 | 12.3 | 100 | 10 | 8 | 100 |
| Example 24 | 2 | AQUAMAT263 | 5 | 130 | 0.50 | 0.75 | 0.3 | 100 | 10 | 8 | 35 |
| Example 25 | 2 | AQUAMAT263 | 350 | 130 | 0.80 | 1.20 | 21.0 | 100 | 30 | 8 | 100 |
| Example 26 | 2 | AQUAMAT272 | 25 | 125 | 0.70 | 1.05 | 1.5 | 100 | 10 | 8 | 40 |
| Example 27 | 2 | AQ1JAMA1272 | 50 | 125 | 0.75 | 1.13 | 3.6 | 100 | 10 | 8 | 60 |
| Example 28 | 2 | AQUAMAT272 | 100 | 125 | 0.80 | 1.20 | 6.3 | 100 | 10 | 8 | 80 |
| Example 29 | 2 | AQUAMAT272 | 200 | 125 | 0.83 | 1.25 | 12.3 | 100 | 10 | 8 | 100 |
| Example 30 | 2 | AQUAMAT272 | 5 | 125 | 0.50 | 0.75 | 0.3 | 100 | 10 | 8 | 35 |
| Example 31 | 2 | AQUAMAT272 | 350 | 125 | 0.80 | 1.20 | 21.0 | 100 | 30 | 8 | 100 |
| Example 32 | 3 | AQUAMAT263 | 25 | 130 | 0.70 | 1.05 | 1.5 | 60 | 30 | 8 | 25 |
| Example 33 | 3 | AQUAMAT263 | 50 | 130 | 0.75 | 1.13 | 3.6 | 60 | 30 | 8 | 30 |
| Example 34 | 3 | AQUAMAT263 | 100 | 130 | 0.80 | 1.20 | 6.3 | 60 | 30 | 8 | 40 |
| Example 35 | 3 | AQUAMAT263 | 200 | 130 | 0.83 | 1.25 | 12.3 | 60 | 30 | 8 | 50 |
| Example 36 | 3 | AQUAMAT272 | 25 | 125 | 0.70 | 1.05 | 1.5 | 60 | 30 | 8 | 25 |
| Example 37 | 3 | AQUAMAT272 | 50 | 125 | 0.75 | 1.13 | 3.6 | 60 | 30 | 8 | 30 |
| Example 38 | 3 | AQUAMAT272 | 100 | 125 | 0.80 | 1.20 | 6.3 | 60 | 30 | 8 | 40 |
| Example 39 | 3 | AQUAMAT272 | 200 | 125 | 0.83 | 1.25 | 12.3 | 60 | 30 | 8 | 50 |
| Comparative Example 1 | 1 | None | — | — | — | — | — | 100 | 10 | 8 | 30 |
| Comparative Example 2 | 1 | SD1000 and LUBA-print VP499/A wax dispersion liquid | 200 | | — | — | 100 | 70 | 10 | 100 | 40 |
| Comparative Example 3 | 2 | None | — | — | — | — | — | 100 | 10 | 8 | 30 |
| Comparative Example 4 | 2 | AQUACER497 | 50 | 60 | 0.70 | 1.05 | 3.6 | 100 | 10 | 8 | 30 |
| Comparative Example 5 | 2 | AQUACER593 | 50 | 160 | 0.70 | 1.05 | 3.6 | 100 | 10 | 8 | 30 |
| Comparative Example 6 | 2 | Opto Beads 6500 M | 100 | — | 6.5 | 6.5 | 5.0 | 100 | 10 | 8 | 30 |
| Comparative Example 7 | 2 | Art Pearl C-800 | 100 | — | 6.0 | 6.0 | 5.0 | 100 | 10 | 8 | 30 |
| Comparative Example 8 | 3 | None | — | — | — | — | — | 60 | 30 | 8 | 10 |

The details of the each material used in the coating solution for projections listed in Table 7 are as follows.
AQUAMAT 272 (modified polyethylene (melting point of 125° C.) dispersion liquid, manufactured by BYK-Chemie Japan K. K.)
AQUACER 531 (modified polyethylene (melting point of 130° C.) dispersion liquid, manufactured by BYK-Chemie Japan K. K.)
AQUACER 531 (modified polyethylene (melting point of 130° C.) dispersion liquid, manufactured by BYK-Chemie Japan K. K.)
CERAFLOUR 927 (modified high-density polyethylene (melting point of 125° C.) dispersion liquid, manufactured by BYK-Chemie Japan K. K.)
AQUACER 539 (modified paraffin wax (melting point of 90° C.) dispersion liquid, manufactured by BYK-Chemie Japan K. K.)
SD1000 and LUBA-print VP499/A wax dispersion liquid: dispersion liquid containing 1.90 g of SD1000 (carboxylic acid modified poly(vinyl alcohol), manufactured by Kuraray Co., Ltd.), 0.08 g of Lutensol (registered trademark) TO10 (ethoxylated alcohol having 13 carbon atoms), 0.26 g of LUBA-print VP499/A wax dispersion liquid (dispersion liquid of wax particles (manufactured by Munzing Liquid Technologies Gmbh) (formed of polyethylene, average particle diameter of 150 nm)), and 50 g of water AQUACER 497 (paraffin wax (melting point of 60° C.) dispersion liquid, manufactured by BYK-Chemie Japan K. K.)

AQUACER 593 (modified polypropylene wax emulsion (melting point of 160° C.) dispersion liquid, manufactured by BYK-Chemie Japan K. K.)

Opto Beads 6500 M (melamine resin-silica composite particles (decomposition start temperature of 350° C.), manufactured by Nissan Chemical Corporation)

Art Pearl C-800 (urethane beads (decomposition start temperature of 320° C.), manufactured by Negami Chemical Industrial Co., Ltd.)

The disclosure of JP2017-167433 filed on Aug. 31, 2017 is incorporated in the present specification by reference.

All documents, patent applications, and technical standards described in the present specification are incorporated herein by reference to the same extent as in a case of being specifically and individually noted that individual documents, patent applications, and technical standards are incorporated by reference.

What is claimed is:

1. A lithographic printing plate precursor comprising:
an image recording layer on a support,
wherein the lithographic printing plate precursor has projections which are discontinuously formed on a surface of an outermost layer on a side where the image recording layer is provided, wherein the image recording layer is negative type image recording layer, and
a melting point of each projection is in a range of 80° C. to 150° C.,
wherein each projection contains 80% by mass or greater of at least one resin selected from the group consisting of polyethylene and modified polyethylene and having a melting point in a range of 80° C. to 150° C., and
the image recording layer contains an infrared absorbent.

2. The lithographic printing plate precursor according to claim 1,
wherein an average dimension of the projections in a surface direction of the outermost layer is in a range of 0.1 μm to 45 μm.

3. The lithographic printing plate precursor according to claim 1,
wherein an average dimension of the projections in a surface direction of the outermost layer is greater than 0.7 μm and less than or equal to 30 μm.

4. The lithographic printing plate precursor according to claim 1,
wherein an occupation area ratio of the projections in the surface of the outermost layer is 20% by area or less.

5. The lithographic printing plate precursor according to claim 1,
wherein an occupation area ratio of the projections in the surface of the outermost layer is in a range of 0.5% by area to 20% by area.

6. A method of producing a lithographic printing plate, comprising:
image-wise exposing a lithographic printing plate precursor to form an exposed portion and an unexposed portion, wherein the lithographic printing plate precursor comprising: an image recording layer on a support, wherein the lithographic printing plate precursor has projections which are discontinuously formed on a surface of an outermost layer on a side where the image recording layer is provided, and a melting point of each projection is in a range of 80° C. to 150° C., wherein each projection contains 80% by mass or greater of at least one resin selected from the group consisting of polyethylene and modified polyethylene; and
supplying at least one of printing ink or dampening water to remove a non-image portion,
wherein an average dimension of the projections in a surface direction of the outermost layer of the lithographic printing plate precursor is greater than 0.7 μm and less than or equal to 30 μm.

7. The method according to claim 6,
wherein an average dimension of the projections in a surface direction of the outermost layer of the lithographic printing plate precursor is in a range of 0.1 μm to 45 μm.

8. The method according to claim 6,
wherein an occupation area ratio of the projections in the surface of the outermost layer of the lithographic printing plate precursor is 20% by area or less.

9. The method according to claim 6,
wherein an occupation area ratio of the projections in the surface of the outermost layer of the lithographic printing plate precursor is in a range of 0.5% by area to 20% by area.

* * * * *